(12) United States Patent
Mejima et al.

(10) Patent No.: US 8,039,305 B2
(45) Date of Patent: Oct. 18, 2011

(54) METHOD FOR BONDING SEMICONDUCTOR WAFERS AND METHOD FOR MANUFACTURING SEMICONDUCTOR DEVICE

(75) Inventors: Kenzou Mejima, Utsunomiya (JP); Satoru Katsurayama, Utsunomiya (JP); Mitsuo Sugino, Utsunomiya (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 2 days.

(21) Appl. No.: 12/597,652

(22) PCT Filed: Apr. 24, 2008

(86) PCT No.: PCT/JP2008/057934
§ 371 (c)(1),
(2), (4) Date: Oct. 26, 2009

(87) PCT Pub. No.: WO2008/136352
PCT Pub. Date: Nov. 13, 2008

(65) Prior Publication Data
US 2010/0129960 A1 May 27, 2010

(30) Foreign Application Priority Data

Apr. 27, 2007 (JP) ................................. 2007-119948
May 29, 2007 (JP) ................................. 2007-142436
Jun. 11, 2007 (JP) ................................. 2007-154250

(51) Int. Cl.
*H01L 21/00* (2006.01)
(52) U.S. Cl. ........ 438/107; 438/109; 438/455; 438/456; 438/459; 257/E21.705; 257/E21.597
(58) Field of Classification Search .......... 438/107–109, 438/455–459, 667; 257/686, 787–793, E25, 257/E21.705
See application file for complete search history.

(56) References Cited

U.S. PATENT DOCUMENTS

| 5,128,746 A | 7/1992 | Pennisi et al. |
| 5,136,365 A | 8/1992 | Pennisi et al. |

(Continued)

FOREIGN PATENT DOCUMENTS

EP 1 384 738 1/2007

(Continued)

OTHER PUBLICATIONS

Supplementary European Search Report for Application No. EP 08 75 2033 dated May 11, 2010.

(Continued)

*Primary Examiner* — Walter L Lindsay, Jr.
*Assistant Examiner* — Abdulfattah Mustapha
(74) *Attorney, Agent, or Firm* — Smith, Gambrell & Russell, LLP

(57) ABSTRACT

In a method for bonding semiconductor wafers of the present invention, a bonding layer containing a flux-active curing agent and a thermosetting resin is interposed between a first semiconductor wafer and a second semiconductor wafer, thereby producing a semiconductor wafer stacked body in which the first and second semiconductor wafers are stacked together, and then the semiconductor wafer stacked body is compressed in a thickness direction thereof while heating it so that the first and second semiconductor wafers are fixed together by melting and solidifying solder bumps while curing the thermosetting resin, thereby producing a semiconductor wafer bonded body in which first connector portions and second connector portions are electrically connected together through solidified products obtained by melting and solidifying the solder bumps.

20 Claims, 11 Drawing Sheets

U.S. PATENT DOCUMENTS

| | | |
|---|---|---|
| 6,617,046 B2 | 9/2003 | Noro et al. |
| 2002/0017710 A1* | 2/2002 | Kurashima et al. ........... 257/686 |
| 2006/0292823 A1 | 12/2006 | Ramanathan et al. |
| 2007/0241436 A1* | 10/2007 | Ookubo et al. ............... 257/678 |

FOREIGN PATENT DOCUMENTS

| JP | 11-3969 | 1/1999 |
|---|---|---|
| JP | 2002-050738 | 2/2002 |
| JP | 2002-232123 | 8/2002 |
| JP | 2002-241472 | 8/2002 |
| JP | 2003-243449 | 8/2003 |
| JP | 2004-291054 | 10/2004 |
| JP | 2004-335647 | 11/2004 |
| JP | 2006-128567 | 5/2006 |

OTHER PUBLICATIONS

International Search Report mailed Jun. 10, 2008 for International Application No. PCT/JP2008/057934.

* cited by examiner

METHOD FOR BONDING SEMICONDUCTOR WAFERS AND METHOD FOR MANUFACTURING SEMICONDUCTOR DEVICE

TECHNICAL FIELD

The present invention relates to a method for bonding semiconductor wafers and a method for manufacturing a semiconductor device.

BACKGROUND ART

In recent years, techniques for packaging a semiconductor integrated circuit with high density are being developed to meet a demand for versatile and compact electronic devices. As one of such packaging techniques, there has been proposed a system-in-package (SiP) semiconductor device of chip-on-chip (CoC) type in which semiconductor chips are stacked and mounted together. This semiconductor device draws attention in that it is excellent in realizing a thin package (see, e.g., patent document 1: Japanese Patent Application Laid-open No. Hei 11-3969).

When stacking semiconductor chips one above another, use is made of, e.g., a method by which each semiconductor chips severed from a wafer are bonded together in a stacked state. However, this method, i.e., the method for producing a stacked body of semiconductor chips by bonding each semiconductor chips together, suffers from an increase in the number of processes and requires a lot of time and labor for manufacture of a large number of stacked semiconductor chips. This poses a problem in that it is impossible to enhance productivity.

As a solution to this problem, there has been proposed a method for manufacturing a system-in-package semiconductor device in which semiconductor wafers are bonded together prior to dicing them into each semiconductor chips. This method will be described now.

Referring first to FIG. 11A, a first semiconductor wafer 510 provided with connector portions 511 and a second semiconductor wafer 520 provided with connector portions 521 are prepared and positioned together so that the connector portions 521 correspond to the connector portions 511. The first and second semiconductor wafers 510 and 520 are bonded together to obtain a semiconductor wafer bonded body 530 (see FIG. 11B).

Then, the semiconductor wafer bonded body 530 is diced as shown in FIG. 11B. This produces a stacked semiconductor chip 560 as shown in FIG. 11C, namely a bonded body consisting of a semiconductor chip 540 severed from the first semiconductor wafer 510 and a semiconductor chip 550 severed from the second semiconductor wafer 520, in which the connector portions 511 and the connector portions 521 are electrically connected together.

As shown in FIG. 11D, the semiconductor chip bonded body 560 is then mounted on an interposer 630 having a wiring pattern 640 and bumps 620 in such a manner as to make contact with the wiring pattern 640, thereby manufacturing a system-in-package semiconductor device 100.

Here, the bonding of the first semiconductor wafer 510 and the second semiconductor wafer 520 in FIG. 11A can be performed by, e.g., compressing the first semiconductor wafer 510 and the second semiconductor wafer 520 together with an anisotropic conductive film (ACF) interposed therebetween. In this method for bonding the semiconductor wafers 510 and 520 with the anisotropic conductive film, electrical connection between the connector portions 511 and 521 is obtained by mutual contact of metal particles contained in the anisotropic conductive film, i.e., point-to-point contact between the metal particles.

If the semiconductor device 100 is operated in this state, a resin component contained in the anisotropic conductive film is expanded or contracted due to heat generated from the semiconductor chip bonded body 560 or a change in an ambient temperature. As a result, distances between the metal particles are changed. In some cases, the metal particles moved in a thickness direction of the anisotropic conductive film come into a non-contact state, thereby changing a resistance value between the connector portions 511 and 521 or breaking conduction between the connector portions 511 and 521. In the method for bonding the semiconductor wafers 510 and 520 with the anisotropic conductive film, therefore, there is a problem in that it is impossible to obtain stable conduction between the connector portions 511 and 521.

DISCLOSURE OF THE INVENTION

It is an object of the present invention to provide a method for bonding semiconductor wafers which is capable of producing a semiconductor wafer bonded body in which the semiconductor wafers are bonded together by providing stable electrical connection between connector portions of the semiconductor wafers stacked together and capable of efficiently manufacturing a plurality of semiconductor elements by dicing the semiconductor wafer bonded body thus produced, and a method for manufacturing a semiconductor device with increased reliability.

In order to achieve the object, the present invention includes the following features (1) to (18):

(1) A method for bonding semiconductor wafers, comprising:

a first process of preparing a first semiconductor wafer including a functional surface and a plurality of first connector portions extending through the first semiconductor wafer in a thickness direction thereof and having functional surface side ends, and a second semiconductor wafer including a rear surface, a plurality of second connector portions extending through the second semiconductor wafer in a thickness direction thereof and having rear surface side ends and a plurality of solder bumps connected to the rear surface side ends of the second connector portions;

a second process of interposing a bonding layer containing a flux-active curing agent and a thermosetting resin as constituent materials thereof between the first semiconductor wafer and the second semiconductor wafer and positioning themselves with alignment so that the functional surface side ends of the first connector portions correspond to the solder bumps connected to the rear surface side ends of the second connector portions, thereby producing a semiconductor wafer stacked body in which the first semiconductor wafer and the second semiconductor wafer are stacked together; and a third process of compressing the semiconductor wafer stacked body in a thickness direction thereof while heating it so that the first semiconductor wafer and the second semiconductor wafer are fixed together by melting and solidifying the solder bumps while curing the thermosetting resin, thereby producing a semiconductor wafer bonded body in which the first connector portions and the second connector portions are electrically connected together through solidified products obtained by melting and solidifying the solder bumps.

(2) The method according to the above feature (1), wherein the bonding layer is formed in the second process by interposing a film-shaped bonding sheet containing the constituent materials of the bonding layer between the first semiconductor wafer and the second semiconductor wafer.

(3) The method according to the above feature (1), wherein the bonding layer is formed in the second process by applying a liquid material containing the constituent materials of the bonding layer on at least one of the functional surface of the first semiconductor wafer and the rear surface of the second semiconductor wafer.

(4) The method according to the above feature (1), wherein the first semiconductor wafer prepared in the first process further includes a plurality of solder bumps connected to the functional surface ends of the first connector portions thereof.

(5) The method according to the above feature (1), wherein when heating and compressing the semiconductor wafer stacked body in the third process, the curing of the thermosetting resin is completed after the solder bumps have been melted.

(6) The method according to the above feature (1), wherein a thickness of the bonding layer in the semiconductor wafer bonded body is in the range of 3 to 200 μm.

(7) The method according to the above feature (1), wherein the constituent materials of the bonding layer further comprise a film-forming resin containing at least one of a (meth) acrylic resin, a phenoxy resin and a polyimide resin.

(8) The method according to the above feature (1) wherein the bonding layer has such a property that it can reduce an oxidation-treated copper plate at a copper oxide reduction rate of 70% or more, when being formed on a surface of the oxidation-treated copper plate and then being subjected to a reduction treatment at 230° C. for one minute in the atmosphere, the copper oxide reduction rate being represented by the following equation (I):

$$\text{copper oxide reduction rate (\%)} = \{1-(\text{oxygen atom concentration after reduction treatment})/(\text{oxygen atom concentration after oxidation treatment})\} \times 100 \qquad (I).$$

(9) A method for bonding semiconductor wafers, comprising:

a first process of preparing a first semiconductor wafer including a functional surface and a plurality of first connector portions extending through the first semiconductor wafer in a thickness direction thereof and having functional surface side ends, and a second semiconductor wafer including a rear surface and a plurality of second connector portions extending through the second semiconductor wafer in a thickness direction thereof and having rear surface side ends;

a second process of interposing a bonding layer containing a flux-active curing agent, a thermosetting resin and solder powder as constituent materials thereof between the first semiconductor wafer and the second semiconductor wafer and positioning themselves with alignment so that the functional surface side ends of the first connector portions correspond to the rear surface side ends of the second connector portions, thereby producing a semiconductor wafer stacked body in which the first semiconductor wafer and the second semiconductor wafer are stacked together; and a third process of compressing the semiconductor wafer stacked body in a thickness direction thereof while heating it so that the first semiconductor wafer and the second semiconductor wafer are fixed together by melting solder particles of the solder powder and solidifying the molten solder particles aggregated between the first connector portions and the second connector portions while curing the thermosetting resin, thereby producing a semiconductor wafer bonded body in which the first connector portions and the second connector portions are electrically connected together through solidified products obtained by solidifying the molten solder particles aggregated.

(10) The method according to the above feature (9), wherein the bonding layer is formed in the second process by interposing a film-shaped bonding sheet containing the constituent materials of the bonding layer between the first semiconductor wafer and the second semiconductor wafer.

(11) The method according to the above feature (9), wherein the bonding layer is formed in the second process by applying a liquid material containing the constituent materials of the bonding layer on at least one of the functional surface of the first semiconductor wafer and the rear surface of the second semiconductor wafer.

(12) The method according to the above feature (9), wherein when heating and compressing the semiconductor wafer stacked body in the third process, the curing of the thermosetting resin is completed after the solder powder has been melted.

(13) The method according to the above feature (9), wherein a thickness of the bonding layer in the semiconductor wafer bonded body is in the range of 3 to 300 μm.

(14) The method according to the above feature (9), wherein an amount of the solder powder contained in the bonding layer is in the range of 20 to 250 parts by weight, based on 100 parts by weight of a total amount of the constituent materials of the bonding layer excluding the solder powder.

(15) The method according to the above feature (9), wherein in the case where the bonding layer has a thickness of 100 μm, a melt viscosity at 138° C. thereof is in the range of 0.01 to 10,000 Pa·s.

(16) The method according to the above feature (1), wherein the flux-active curing agent has at least one of a carboxyl group and a phenolic hydroxyl group.

(17) The method according to the above feature (1), wherein the thermosetting resin comprises an epoxy resin.

(18) A method for manufacturing a semiconductor device, comprising the processes of:

preparing a semiconductor wafer bonded body produced by the method defined by claim 1 in which a plurality of each circuit portions are formed on the functional surface of the first semiconductor wafer;

dicing the semiconductor wafer bonded body in a corresponding relationship with the each circuit portions, thereby separating the semiconductor wafer bonded body into a plurality of semiconductor elements with the each circuit portions; and mounting the diced semiconductor elements on a substrate.

BEST MODE FOR CARRYING OUT THE INVENTION

Hereinafter, a method for bonding semiconductor wafers and a method for manufacturing a semiconductor device in accordance with the present invention will be described in detail with reference to accompanying drawings.

First, a semiconductor device manufactured using the method for manufacturing a semiconductor device of the present invention will be described prior to describing the method for bonding semiconductor wafers of the present invention.

Figure 1:
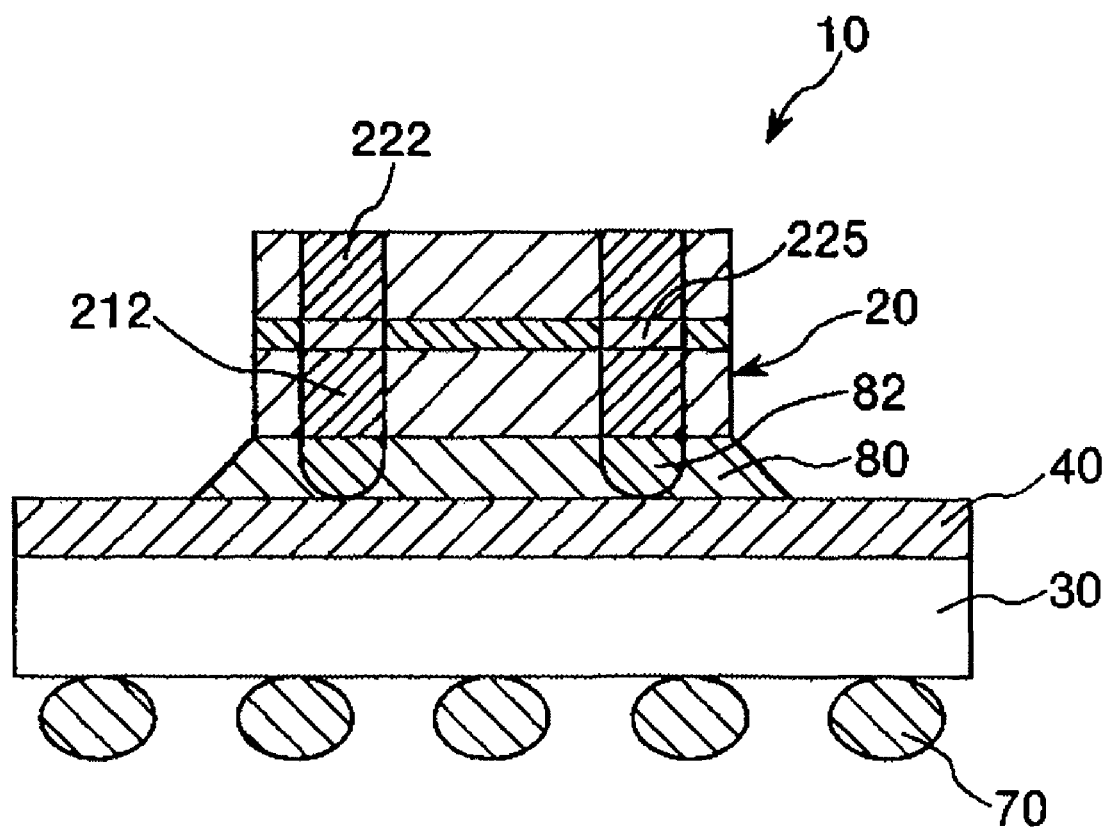
FIG. 1 is a vertical section view showing one example of a semiconductor device manufactured using a method for manufacturing a semiconductor device of the present invention.

FIG. 1 is a vertical section view showing one example of the semiconductor device manufactured using the method for manufacturing a semiconductor device of the present invention. In the following description, an upper side in FIG. 1 will be referred to as "upper" and a lower side therein as "lower".

A semiconductor device 10 shown in FIG. 1 is a chip-on-chip (CoC) type system-in-package (SiP) and includes a semiconductor chip (or a stacked body of two semiconductor chips) 20, an interposer (or a substrate) 30 for supporting the semiconductor chip 20, a wiring pattern 40 formed into a predetermined pattern and a plurality of conductive bumps (or terminals) 70.

The interposer 30 is an insulating substrate and is made of, e.g., various kinds of resin materials such as polyimide resin, epoxy resin, cyanate resin and bismaleimide triazine resin (BT resin). When seen in a plan view, the interposer 30 has a generally quadrangular shape such as a square shape or a rectangular shape.

The wiring pattern 40 made of, e.g., a conductive metallic material such as copper, is provided on an upper surface (one surface) of the interposer 30 in a predetermined shape.

Further, a plurality of vias (or through-holes) not shown in the drawings are formed so as to extend through the interposer 30 in a thickness direction thereof.

One end (an upper end) of each of the bumps 70 is electrically connected to a portion of the wiring pattern 40 through each of the vias. The other end (a lower end) thereof protrudes from a lower surface (the other surface) of the interposer 30.

A portion of each of the bumps 70 protruding from the interposer 30 has a generally spherical shape (or a ball-like shape).

The bumps 70 are mainly composed of a soldering material such as solder, silver solder, copper solder, phosphor copper solder.

The wiring pattern 40 is formed on the interposer 30. The semiconductor chip 20 is electrically connected to the wiring pattern 40 through connector portions 82.

Further, a gap between the semiconductor chip 20 and the interposer 30 or the wiring pattern 40 is filled with an encapsulation composed of various kinds of resin materials such as epoxy based resin. An encapsulated layer 80 is formed from a cured product of the encapsulated resin. The encapsulated layer 80 has a function of increasing bonding strength between the semiconductor chip 20 and the interposer 30 or the wiring pattern 40 and a function of preventing foreign matters or moistures from infiltrating into the gap described above.

Such a semiconductor device 10 can be manufactured as follows.

Figure 2:
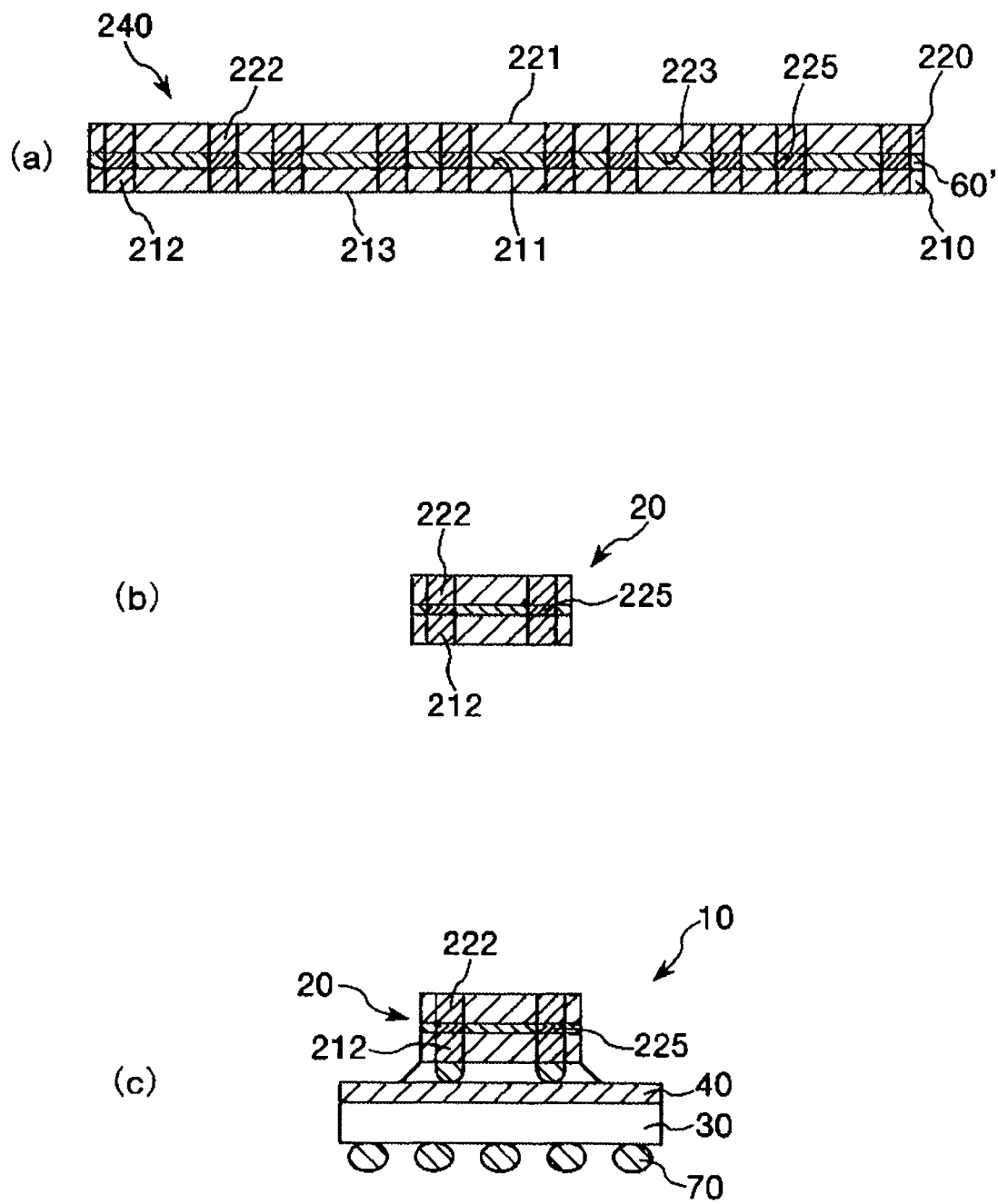
FIGS. 2A to 2C are vertical section views for explaining the method for manufacturing a semiconductor device of the present invention.

FIGS. 2A to 2C are vertical section views for explaining the method for manufacturing a semiconductor device. FIGS. 3A to 3E are vertical section views for explaining a first method for bonding semiconductor wafers. FIGS. 4A to 4D are vertical section views for explaining a second method for bonding semiconductor wafers. FIGS. 5A to 5E are vertical section views for explaining a third method for bonding semiconductor wafers. FIGS. 6A to 6D are vertical section views for explaining a fourth method for bonding semiconductor wafers. In the following description, an upper side in FIGS. 2A to 2C, 3A to 3E, 4A to 4D, 5A to 5E and 6A to 6D will be referred to as "upper" and a lower side therein as "lower".

[1] First, as shown in FIG. 2A, a semiconductor wafer bonded body 240 in which a first semiconductor wafer 210 and a second semiconductor wafer 220 are bonded together through a bonding layer 60' is prepared.

The method for bonding semiconductor wafers of the present invention is used in producing this semiconductor wafer bonded body 240.

Hereinafter, description will be made on a method for manufacturing, using the method for bonding semiconductor wafers of the present invention, the semiconductor wafer bonded body 240 in which the first semiconductor wafer 210 and the second semiconductor wafer 220 are bonded together through the bonding layer 60'.

In this regard, each of the first and second methods for bonding semiconductor wafers which will be described below is directed to a case where constituent materials of a bonding layer 60 to be provided between the first and second semiconductor wafers 210 and 220 do not contain any solder powder and where solder bumps 224 are provided in contact with connector portions 222 of the second semiconductor wafer 220. In contrast, each of the third and fourth methods for bonding semiconductor wafers which will be described below is directed to a case where the constituent materials of the bonding layer 60 contain the solder powder and where the solder bumps 224 are not provided in the connector portions 222.

<First Method for Bonding Semiconductor Wafers>

First, description will be made on the method for producing the semiconductor wafer bonded body 240 using the first method for bonding semiconductor wafers.

[1A-1] First, the first semiconductor wafer 210 and the second semiconductor wafer 220 each having a plurality of each circuit portions not shown in the drawings are prepared (first process).

Figure 3:
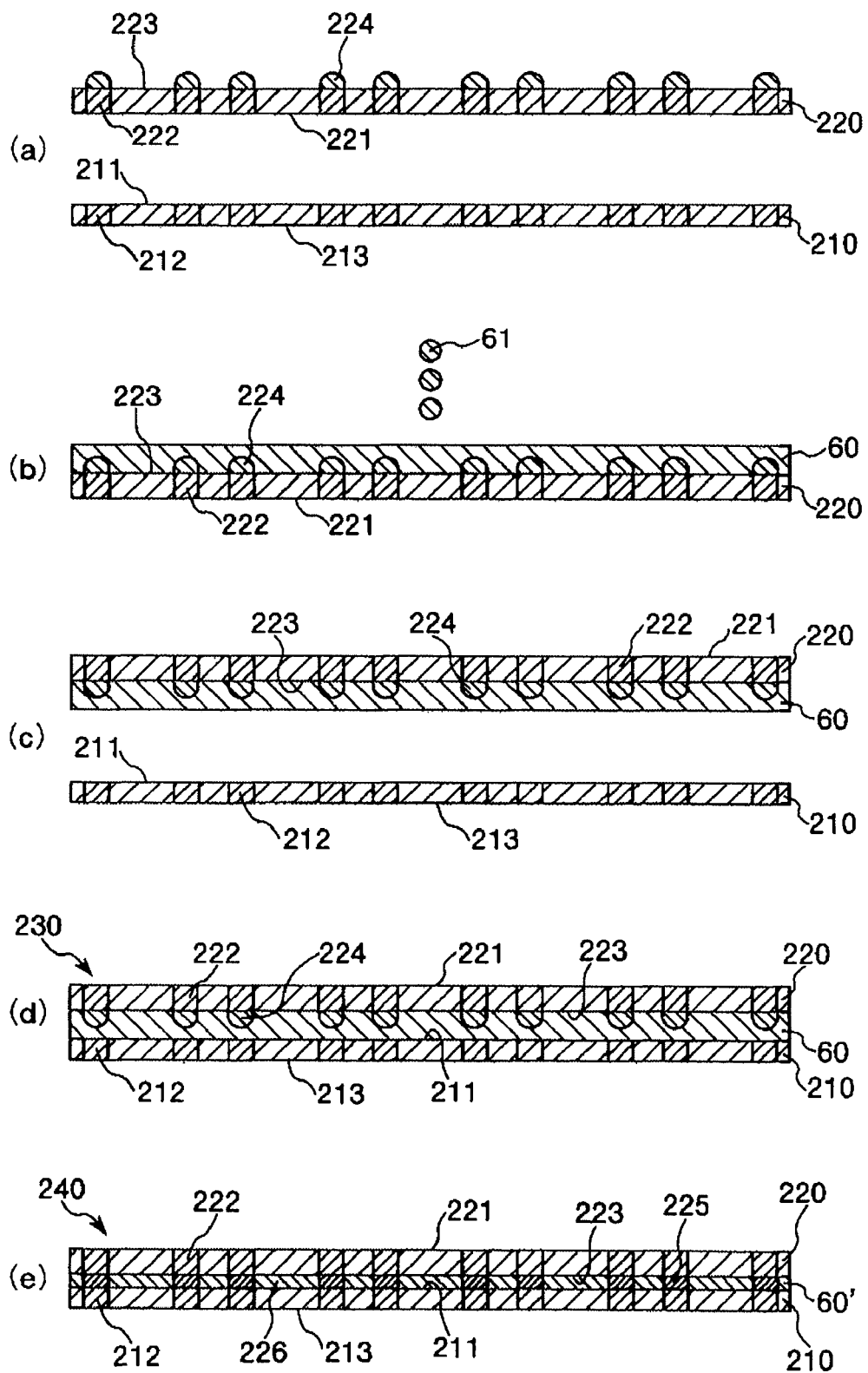
FIGS. 3A to 3E are vertical section views for explaining a first method for bonding semiconductor wafers.

In this embodiment, as shown in FIG. 3A, the first semiconductor wafer 210 includes a plurality of electrodes (not shown) provided on a functional surface 211 thereof and connected to the each circuit portions, and a plurality of connector portions (or conductive posts) 212 provided so as to extend through the first semiconductor wafer 210 in a thickness direction thereof and electrically connected to the electrodes.

Further, as shown in FIG. 3A, the second semiconductor wafer 220 includes a plurality of electrodes (not shown) provided on a functional surface 221 thereof and connected to the each circuit portions, a plurality of connector portions 222 provided so as to extend through the second semiconductor wafer 220 in a thickness direction thereof and electrically connected to the electrodes, and the solder bumps 224 connected to ends of the connector portions (or conductive posts) 222 on the side of a rear surface 223 of the second semiconductor wafer 220.

The formation of the solder bumps 224 on the ends of the connector portions (second connector portions) 222 on the side of the rear surface 223 can be performed by many different methods. Examples of such methods include a method for mounting ball-shaped solders on the ends (rear surface side ends) of the connector portions 222, a method for printing a solder paste thereon and a method for growing bumps using a plating process. The solder bumps 224 thus formed may be subjected to a reflow treatment after their formation.

Although the solder bumps 224 are formed only on the side of the rear surface 223 of the second semiconductor wafer 220 in FIG. 3A, it is preferred that the solder bumps 224 are also formed so as to be connected to ends (functional surface side ends) of the connector portions (first connector portions) 212 on the side of the functional surface 211 of the first semiconductor wafer 210. This makes it possible for the connector portions 212 and 222 to be electrically connected through joint portions 225 which will be described below in a reliable manner.

Further, the solder bumps 224 may be additionally formed so as to be connected to ends of the connector portions 212 on the side of a rear surface 213 of the first semiconductor wafer 210, and formed so as to be connected to ends of the connector portions 222 on the side of the functional surface 221 of the second semiconductor wafer 220.

It is preferred that a solder component of the solder bumps 224 is an alloy containing two or more metals selected from the group comprising tin (Sn), silver (Ag), bismuth (Si), indium (In), zinc (Zn), lead (Pb) and copper (Cu). In terms of melting temperature and mechanical properties of the solder bumps 224, it is particularly preferable to use a Sn-containing alloy such as a Sn—Pb alloy, a Sn—Bi alloy, a Sn—Ag alloy, a Sn—Ag—Cu alloy or a Sn—In alloy.

In general, a melting point of the solder bumps 224 is preferably in the range of about 100 to 250° C., and more preferably in the range of about 130 to 230° C. This makes it possible to sufficiently secure flowability of a thermosetting resin and the like contained in the bonding layer 60 before being cured, and to reliably prevent thermal degradation of the each circuit portions provided on the first and second semiconductor wafers 210 and 220.

In this regard, it is to be noted that the melting point of the solder bumps 224 is defined by an endothermic peak temperature of solder powder itself constituting the solder bumps 224 measured using, e.g., a DSC (Differential Scanning Calorimetry) method, at a temperature increasing rate of 10° C./min.

Sizes of the solder bumps 224 are set such that diameters thereof are preferably in the range of about 1 to 500 μm, more preferably in the range of about 5 to 300 μm, and even more preferably in the range of about 10 to 200 μm. This makes it possible to sufficiently secure electrical connection reliability between the connector portions 212 and 222 through the joint portions 225 which will be described below.

[1A-2] Next, as shown in FIG. 3B, the bonding layer 60 is formed by applying a liquid material 61 containing a flux-active curing agent and a thermosetting resin as constituent materials thereof on the rear surface 223 of the second semiconductor wafer 220.

Many different application methods can be used in applying the liquid material 61 on the rear surface 223. Examples of the application methods include a spin coat method, a casting method, a micro gravure coat method, a bar coat method, a roll coat method, a dip coat method, a spray coat method, a screen printing method, a flexographic printing method, an offset printing method, an inkjet printing method, and the like. With these application methods, it is possible to supply the liquid material 61 on the rear surface 223 in an easier matter.

The bonding layer 60 is formed by, e.g., removing a solvent contained in the liquid material 61, namely drying the liquid material 61, after applying the liquid material 61 on the rear surface 223.

The liquid material 61 may be dried either naturally or artificially, e.g., by heating the second semiconductor wafer 220 with a heater or the like.

A thickness (an average thickness) of the bonding layer 60 is not particularly limited to a specific value, but may be preferably in the range of about 5 to 300 μm, and more preferably in the range of about 10 to 200 μm.

Further, if necessary, the bonding layer 60 may be subjected to a temporary curing treatment. This makes it possible to reliably keep a shape of the bonding layer 60 thus formed.

In this embodiment, the bonding layer 60 is provided only on the rear surface 223 of the second semiconductor wafer 220. Alternatively, the bonding layer(s) 60 may be provided only on the functional surface 211 of the first semiconductor wafer 210 or on both the rear surface 223 of the second semiconductor wafer 220 and the functional surface 211 of the first semiconductor wafer 210. From the viewpoint of simplifying the processes in the method for bonding semiconductor wafers, it is preferred that the bonding layer 60 is provided on one of the rear surface 223 and the functional surface 211. On the other hand, from the standpoint of enhancing adhesion between the first and second semiconductor wafers 210 and 220 in the semiconductor wafer bonded body 240 produced, it is preferred that the bonding layers 60 are formed on both the rear surface 223 and the functional surface 211.

The flux-active curing agent serves to reduce surfaces of the solder bumps 224 when heating and compressing a semiconductor wafer stacked body 230 in a process [1A-4] which will be described below. This makes it possible to increase wettability of a solder component constituting the solder bumps 224, and to enhance agglutinability of molten solder bumps 224 between the connector portions 212 and 222 which will be described below. As a result, the connector portions 212 and 222 can be connected through the joint portions 225 formed from solidified products of the molten solder bumps 224, which makes it possible to reliably obtain conduction between the connector portions 212 and 222 through the joint portions 225.

Further, it is preferred that such a flux-active curing agent has a functional group bondable to the thermosetting resin. Thus, the flux-active curing agent serves as a curing agent when thermally curing the thermosetting resin and is bonded to the thermosetting resin. As a result, it is possible to appropriately suppress occurrence of ion migration which would be caused by flux component residues in the bonding layer 60' of the semiconductor wafer bonded body 240 produced. Furthermore, the bonding of the flux-active curing agent to the thermosetting resin also provides an effect of increasing an elastic modulus and/or a glass transition temperature (Tg) of a cured product of the thermosetting resin.

Taking the above facts into account, it is preferred that a curing agent having a carboxyl group and/or a phenolic hydroxyl group is used as the flux-active curing agent.

In this regard, it is to be noted that the flux-active curing agent having a carboxyl group and/or a phenolic hydroxyl group (hereinafter abbreviated as "flux-active curing agent") refers to a curing agent having a carboxyl group and/or a phenolic hydroxyl group in a molecule thereof. Such a flux-active curing agent may be in the form of a liquid or a solid.

Examples of the flux-active curing agent having a carboxyl group include an aliphatic acid anhydride, an alicyclic acid anhydride, an aromatic acid anhydride, an aliphatic carboxylic acid, an aromatic carboxylic acid, and the like.

Examples of the aliphatic acid anhydride include succinic acid anhydride, polyadipic acid anhydride, polyazelaic acid anhydride, polysebacic acid anhydrate, and the like.

Examples of the alicyclic acid anhydride include methyl tetrahydrophthalic acid anhydride, methyl hexahydrophthalic acid anhydride, methyl himic acid anhydride, hexahydrophthalic acid anhydride, tetrahydrophthalic acid anhydride, trialkyl tetrahydrophthalic acid anhydride, methyl cyclohexene dicarboxylic acid anhydride, and the like.

Examples of the aromatic acid anhydride include phthalic acid anhydride, trimellitic acid anhydride, pyromellitic acid dianhydride, benzophenone tetracarboxylic acid anhydrate, ethylene glycol bistrimellitate, glycerol tristrimellitate, and the like.

Examples of the aliphatic carboxylic acid include a compound represented by the following general formula (1), formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid, and the like.

$$\text{HOOC—(CH}_2)_n\text{—COOH} \qquad (1)$$

[wherein in the above formula, "n" is an integer of 0 to 20.]

Examples of the aromatic carboxylic acid include benzoic acid, phthalic acid, isophthalic acid, terephthalic acid, hemimellitic acid, trimellitic acid, trimesic acid, mellophanic acid, prehnitic acid, pyromellitic acid, mellitic acid, triilic acid, xylic acid, hemelitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid, phenol phthalin, diphenolic acid, and the like.

Among them, it is preferable to use the compound represented by the above general formula (1) in order to keep a balance between an activation degree of the flux-active curing agent, an amount of outgases which would be generated when curing the thermosetting resin, and an elastic modulus or glass transition temperature of the bonding layer 60' of the semiconductor wafer bonded body 240. More preferably, "n" in the above general formula (1) is in the range of about 3 to 10. This makes it possible to suppress an increase in the elastic modulus of the cured product of the thermosetting resin present in the semiconductor wafer bonded body 240, and to improve adhesion between the cured product of the thermosetting resin and the first and second semiconductor wafers 210 and 220.

Examples of the compound represented by the above general formula (1) and having "n" of 3 to 10 include glutaric acid ("n"=3: HOOC—(CH$_2$)$_3$—COOH), adipic acid ("n"=4: HOOC—(CH$_2$)$_4$—COOH), pimelic acid ("n"=5: HOOC—(CH$_2$)$_5$—COOH), sebacic acid ("n"=8: HOOC—(CH$_2$)$_8$—COOH), HOOC—(CH$_2$)$_n$—COOH ("n"=10), and the like.

Further, examples of the flux-active curing agent having a phenolic hydroxyl group include phenols. Specifically, examples of the phenols include monomers each having a phenolic hydroxyl group such as phenol, o-cresol, 2,6-xylenol, p-cresol, m-cresol, o-ethyl phenol, 2,4-xylenol, 2,5-xylenol, m-ethyl phenol, 2,3-xylenol, meditol, 3,5-xylenol, p-tertiarybutyl phenol, catechol, p-tertiaryamyl phenol, resorcinol, p-octyl phenol, p-phenyl phenol, bisphenol A, bisphenol F, bisphenol AF, biphenol, diallyl bisphenol F, diallyl bisphenol A, trisphenol, tetrakisphenol, phenol novolak resin, o-cresol novolak resin, bisphenol F novolak resin, bisphenol A novolak resin, and the like.

The above described flux-active curing agent having a carboxyl group and/or a phenolic hydroxyl group is three-dimensionally introduced into the cured product of the thermosetting resin such as epoxy resin or the like by reaction therewith.

From the viewpoint of promoting formation of three-dimensional networks of the cured product of the epoxy resin, it is preferred that the flux-active curing agent contains, in one molecule thereof, at least two phenolic hydroxyl groups which can be bonded to the epoxy resin and at least one carboxyl group which is directly bonded to an aromatic ring showing a flux action (or a reducing action) with respect to the solder bumps 224.

Examples of such a flux-active curing agent include: benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid and gallic acid (3,4,5-trihydroxybenzoic acid); naphthoic acid derivatives such as 1,4-dihydroxy-2-naphthoic acid, 3,5-dihydroxy-2-naphthoic acid and 3,7-dihydroxy-2-naphthoic acid; phenol phthalin; diphenolic acid; and the like, one or more of which may be used independently or in combination.

Further, an amount of the flux-active curing agent contained in the bonding layer 60 is preferably in the range of about 1 to 30 wt %, and more preferably in the range of about 5 to 25 wt %, based on a total amount of the constituent materials of the bonding layer 60. This makes it possible to enhance the flux activation in the bonding layer 60, and to prevent the flux-active curing agent from remaining unreacted with the thermosetting resin in the bonding layer 60' of the semiconductor wafer bonded body 240, thereby appropriately inhibiting occurrence of ion migration which would be caused by the residual flux-active curing agent.

In the semiconductor wafer bonded body 240 obtained in the subsequent process [1A-4], the thermosetting resin serves to insulate the adjacent joint portions 225 by an insulating portion 226 composed from the cured product of the thermosetting resin, and to fix (or bond) the first and second semiconductor wafers 210 and 220 together.

Examples of such a thermosetting resin include, but are not particularly limited to, epoxy resin, oxetane resin, phenol resin, (meth)acrylic resin, unsaturated polyester resin, diallyl phthalate resin, maleimide resin, and the like. Among them, the epoxy resin is preferably used. Use of the epoxy resin is preferred because it is superior in curability and storage stability while the cured product thereof is excellent in heat resistance, moisture resistance and chemical resistance.

As the epoxy resin, it may be possible to use an epoxy resin kept in a solid state at room temperature, an epoxy resin kept in a liquid state at room temperature, or a mixture thereof. By using such an epoxy resin, it becomes possible to increase a degree of freedom in designing melting behavior of the thermosetting resin.

Examples of the epoxy resin kept in a solid state at room temperature include, but are not particularly limited to, bisphenol A type epoxy resin, bisphenol S type epoxy resin, phenol novolak type epoxy resin, cresol novolak type epoxy resin, glycidyl amine type epoxy resin, glycidyl ester type epoxy resin, three functional epoxy resin, four functional epoxy resin and the like, more specifically, a mixture of solid three functional epoxy resin and cresol novolak type epoxy resin, one or more of which may be used independently or in combination.

On the other hand, examples of the epoxy resin kept in a liquid state at room temperature include, but are not particularly limited to, bisphenol A type epoxy resin, bisphenol F type epoxy resin, and the like, one or more of which may be used independently or in combination.

An epoxy equivalent of the epoxy resin kept in a liquid state at room temperature is preferably in the range of 150 to 300, more preferably in the range of 160 to 250, and even more preferably in the range of 170 to 220. This makes it possible to prevent the cured product of the thermosetting resin from having an increased contraction percentage. As a result, it is possible to reliably prevent the semiconductor wafer bonded body 240 from causing warp due to existence of the insulating portion 226 and to reliably prevent reduction in reactivity with a polyimide resin.

Further, an amount of the thermosetting resin contained in the bonding layer 60 is preferably in the range of about 25 to 75 wt %, and more preferably in the range of about 45 to 70 wt %, based on the total amount of the constituent materials of the bonding layer 60. This makes it possible to obtain superior curability of the thermosetting resin when curing it, and to design good melting behavior of the bonding layer 60.

In addition, it is also preferred that a curing agent other than the flux-active curing agent (hereinafter simply referred to as "curing agent") is added to the thermosetting resin. This makes it possible to further enhance the curability of the thermosetting resin.

Examples of the curing agent include, but are not particularly limited to, phenols, amines, and thiols. Among them, it is preferable to use the phenols in the case where the epoxy resin is used as the thermosetting resin. This makes it possible for the curing agent to show good reactivity with the epoxy resin in the bonding layer 60. Furthermore, this ensures that the epoxy resin contained in the bonding layer 60 enjoys a reduced change in size during the curing process and has well-suited physical properties (e.g., thermal resistance and moisture resistance) after the curing process.

Further, although the phenols are not particularly limited to specific types, a phenol compound having two or more functional groups capable of reacting with the epoxy resin is used preferably. This makes it possible to improve the physical properties (e.g., thermal resistance and moisture resistance) of the cured product of the epoxy resin in the bonding layer 60'.

Examples of such phenols, specifically, include bisphenol A, tetramethyl bisphenol A, diallyl bisphenol A, biphenol, bisphenol F, diallyl bisphenol F, trisphenol, tetrakisphenol, phenol novolaks, cresol novolaks, and the like. Among them, the phenol novolaks and the cresol novolaks are preferably used. This makes it possible to preferably adjust a melt viscosity of the bonding layer 60. As a result, it is possible for the curing agent to show good reactivity with the epoxy resin in the bonding layer 60. Furthermore, this makes it possible for the cured product of the epoxy resin contained in the bonding layer 60' to have more excellent physical properties (e.g., thermal resistance and moisture resistance).

Further, in the case where the phenol novolaks are used as the curing agent, an amount of the curing agent contained in the bonding layer 60 is preferably in the range of about 5 to 30 wt %, and more preferably in the range of about 10 to 25 wt %, based on the total amount of the constituent materials of the bonding layer 60. This makes it possible to reliably cure the thermosetting resin in the bonding layer 60, to prevent the curing agent from remaining unreacted with the thermosetting resin in the bonding layer 60', and to appropriately prevent occurrence of ion migration which would be caused if the curing agent remains unreacted.

In this regard, it is to be noted that in the case where the epoxy resin is used as the thermosetting resin, the amount of the phenol novolaks contained in the bonding layer 60 may be defined by an equivalent ratio to the epoxy resin.

More specifically, the equivalent ratio of the phenol novolaks to the epoxy resin is preferably in the range of about 0.5 to 1.2, more preferably in the range of about 0.6 to 1.1, and even more preferably in the range of about 0.7 to 0.98. This makes it possible to provide the same effects as set forth above.

In addition to the curing agent described above, it may be possible to use, e.g., an imidazole compound having a melting point of 150° C. or more. This makes it possible for the molten solder bumps 224 to reliably be aggregated between the connector portions 212 and 222, and also makes it possible for the connector portions 212 and 222 to be electrically connected together through the joint portions 225 formed from the solidified products of the molten solder bumps 224 in a reliable manner.

Examples of this imidazole compound having a melting point of 150° C. or more include 2-phenyl hydroxyimidazole, 2-phenyl-4-methyl hydroxyimidazole, and the like. In this regard, it is to be noted that an upper limit of the melting point of the imidazole compound is not particularly limited to a specific value, but may be appropriately set depending on a bonding temperature of the bonding layer 60.

In the case where such an imidazole compound is used as the curing agent, an amount of the curing agent contained in the bonding layer 60 is preferably in the range of about 0.005 to 10 wt %, and more preferably in the range of about 0.01 to 5 wt %, based on the total amount of the constituent materials of the bonding layer 60. This makes it possible for the curing agent to effectively perform its function as a catalyst for curing the thermosetting resin, and to improve the curability of the thermosetting resin in the bonding layer 60'. In addition, this also makes it possible to obtain good joint portions 225 in the bonding layer 60 without allowing a melt viscosity of the thermosetting resin to be unduly increased at the melting temperature of the solder bumps 224.

In this regard, it is to be noted that the curing agents described above may be used independently or in combination.

Further, other constituent materials than the flux-active curing agent and the thermosetting resin may be appropriately added to the bonding layer 60, examples of which include a coupling agent, a flux activator for increasing the activity of the flux-active curing agent and various kinds of additives for improving different properties such as resin compatibility, stability and workability.

Use of such a coupling agent makes it possible to further increase the adhesion of the bonding layer 60 to the first and second semiconductor wafers 210 and 220.

Examples of the coupling agent include silane coupling agents such as an epoxy silane coupling agent and an aromatic-containing amino silane coupling agent, and the like, one or more of which can be used independently or in combination.

An amount of the coupling agent contained in the bonding layer 60 is preferably in the range of about 0.01 to 5 wt %, based on the total amount of the constituent materials of the bonding layer 60.

Further, a solvent contained in the liquid material 61 described above is not particularly limited to a specific type, but is preferably one inert to the constituent materials of the bonding layer 60 (or the liquid material 61).

Examples of such a solvent include: ketones such as acetone, methyl ethyl ketone, methyl isobutyl ketone, DIBK (diisobutyl ketone), cyclohexanone and DAA (diacetone alcohol); aromatic hydrocarbons such as benzene, xylene and toluene; alcohols such as methyl alcohol, ethyl alcohol, isopropyl alcohol and n-butyl alcohol; cellosolve based solvents such as methyl cellosolve, ethyl cellosolve, butyl cellosolve, methyl cellosolve acetate, ethyl cellosolve acetate, BCSA (butyl cellosolve acetate); NMP (N-methyl-2-pyrolidone); THF (tetrahydrofuran); DMF (dimethyl formamide); DBE (dibasic acid ester); EEP (ethyl 3-ethoxypropionate); DMC (dimethyl carbonate); and the like.

Further, an amount of the solvent contained in the liquid material 61 is preferably set in such a range that an amount of solid components to be mixed in the solvent (namely, the total amount of the constituent materials of the above described bonding layer 60) becomes equal to about 10 to 60 wt %.

In this regard, it is preferred that the bonding layer 60 formed on the rear surface 223 using the liquid material 61 containing the flux-active curing agent, the thermosetting resin, and the like has the following properties.

First, the bonding layer 60 formed on the rear surface 223 has such a property that it can reduce an oxidation-treated copper plate at a predetermined copper oxide reduction rate. In this embodiment, the copper oxide reduction rate can be calculated as follows. Namely, after the bonding layer 60 is attached to a surface of the oxidation-treated copper plate, and then is subjected to a reduction treatment at 230° C. for one minute in the atmosphere, the copper oxide reduction rate is calculated by the following equation (I):

copper oxide reduction rate (%)={1−(oxygen atom concentration after reduction treatment)/(oxygen atom concentration after oxidation treatment)}× 100      (I).

In this regard, the flux-active curing agent serves to reduce oxide films covering the surfaces of the solder bumps 224, and therefore has a reduction power for removal of the oxide films. The above copper oxide reduction rate (%) is used as an index indicating the reduction power for removal of the oxide films. The copper oxide reduction rate great enough to remove the oxide films is preferably 70% or more, more preferably 75% or more, and even more preferably 80% or more. This makes it possible to increase a removal rate of the oxide films formed on the surfaces of the solder bumps 224, and to enhance bonding reliability between the connector portions 212 and 222 through the joint portions 225 under different post-bonding environments.

Measurement conditions of the copper oxide reduction rate (%) are adjusted such that the reduction treatment is performed for one minute at 230° C. in the atmosphere.

More specifically, the copper oxide (CuO) reduction rate is calculated using, e.g., the following measurement method.

(1A) A copper plate having a thickness of 70 μm ("3EC-3" produced by Mitsui Mining and Smelting Co., Ltd.) is softly etched using a commercially available etching solution to cut away a surface thereof by a thickness of 2 to 3 μm.

(2A) Using an oven, the softly etched copper plate is subjected to an oxidation treatment for thirty minutes at 220° C. in the atmosphere.

(3A) A bonding layer 60 having a thickness of 25 μm is attached to a surface of the oxidation-treated copper plate and is subjected to a reduction treatment for one minute at 230° C. in the atmosphere.

(4A) Within one minute after the reduction treatment performed in the above process (3A), a component (a resin component) of the bonding layer 60 remaining on the surface of the reduction-treated copper plate is removed with acetone.

(5A) The copper plate from which the resin component has been removed is rapidly transferred to a vacuum desiccator, and then is dried under vacuum. Thereafter, the copper plate is stored in a vacuum atmosphere until ESCA measurement is performed.

(6A) The surface of the copper plate subjected to only the oxidation treatment and the surface of the copper plate subjected to the reduction treatment are cut away by a thickness of 40 Å using a plasma treatment. Then, concentrations of Cu and O atoms are measured with an ESCA (produced by ULVAC-PHI, Inc.). The plasma treatment and the ESCA measurement are performed in a vacuum atmosphere. The purpose of cutting away the surfaces of the copper plates by a thickness of 40 Å using the plasma treatment is to eliminate influence of surface oxidation possibly occurring in handling the copper plates during the measurement.

In this regard, it is to be noted that the ESCA measurement is performed under the conditions: (i) a photoelectron escape angle of 45 degrees; (ii) an X-ray source of Alkα rays (monochrome); and (iii) an analysis range of 0.8 mmφ.

(7A) The copper oxide reduction rate is calculated by the following equation (I):

$$\text{copper oxide reduction rate (\%)} = \left\{ 1 - \frac{\left(\begin{array}{c}\text{oxygen atom concentration} \\ \text{after reduction treatment}\end{array}\right)}{\left(\begin{array}{c}\text{oxygen atom concentration} \\ \text{after oxidation treatment}\end{array}\right)} \right\} \times 100. \quad (I)$$

Second, the bonding layer 60 formed on the rear surface 223 has such a property that solder balls placed thereon are wet spread at a predetermined solder wet spread rate. In this embodiment, the solder wet spread rate can be calculated as follows. Namely, after tin-containing solder balls each having a diameter of 500 μm are placed on the bonding layer 60, and then are heated for twenty seconds at a temperature 30° C. higher than a melting point of the solder balls, this solder wet spread rate is calculated by the following equation (II):

$$\text{solder wet spread rate (\%)} = \left[ \frac{\left\{ \text{(solder ball diameter)} - \left(\begin{array}{c}\text{solder thickness} \\ \text{after wet spread}\end{array}\right) \right\}}{\text{(solder ball diameter)}} \right] \times 100. \quad (II)$$

In this regard, in the case where the connector portions 212 and 222 are metallically bonded by the solidified products of the molten solder bumps 224, bonding strength therebetween tends to increase by promoting intermetallic bonding as the solder wet spread rate becomes greater. The solder wet spread rate great enough to prevent occurrence of defective bonding is preferably 40% or more, more preferably 45% or more, and even more preferably 50% or more. This makes it possible to increase bonding probability between the connector portions 212 and 222, and to enhance bonding reliability between the connector portions 212 and 222 through the joint portions 225 under different post-bonding environments.

If it is desired that the solder wet spread rate of the bonding layer 60 is set to a value of 60% or more, it is preferable to use the flux-active curing agent containing the aliphatic dicarboxylic acid. By using such an aliphatic dicarboxylic acid with high flux activity, it is possible to impart high solder wet spread rate of 60% or more together with strong reduction power to the bonding layer 60. As a result, the agglutinability of the molten solder bumps 224 can be increased in the bonding layer 60, thereby securing electrical connection reliability between the connector portions 212 and 222.

On the other hand, if it is desired that the solder wet spread rate of the bonding layer 60 is set to a value of 40 to 60%, it is preferable to use the flux-active curing agent containing the compound having a carboxyl group and a phenolic hydroxyl group. By using such a compound, it is possible to reliably set the solder wet spread rate of the bonding layer 60 to fall within the above range, and to impart slightly strong reduction power to the bonding layer 60. Further, since the above compound is one having high reactivity with the curable resin (e.g., the epoxy resin), it is possible to effectively suppress occurrence of ion migration which would be caused by flux residues.

The solder wet spread rate is measured in the following conditions. For example, the solder balls are heated at the temperature 30° C. higher than the melting point thereof in order to reduce variations in a degree of wet spread of the solder balls. A heating time is set equal to twenty seconds by taking into account a time required until the flux-active curing agent is melted and moved onto surfaces of the solder balls to thereby wet spread the solder balls, and the variations in the degree of wet spread of the solder balls.

More specifically, the solder wet spread rate can be calculated using, e.g., the following measurement method.

(1B) Bonding layers 60 each having a thickness of 15 μm is attached to bare copper plates (produced by Hirai Seimitsu Kogyo Corp.), respectively.

(2B) The following solder balls (i) and (ii) each having a diameter of 500 μm are placed on the bonding layers 60, respectively to obtain two samples.

(i) "M31" (a Sn/Ag/Cu alloy having a melting point of 217° C. produced by Senju Metal Industry Co., Ltd.)

(ii) "L20" (a Sn/Bi alloy having a melting point of 138° C. produced by Senju Metal Industry Co., Ltd.).

(3B) According to ASTM B 545, a hot plate is heated to a temperature 30° C. higher than a melting point of each solder ball. Each of the samples described just above is heated on the hot plate for twenty seconds.

(4B) A height of each solder ball wet spread over the bonding layer 60 is measured.

(5B) The solder wet spread rate is calculated by the following equation (II):

$$\text{solder wet spread rate (\%)} = \left[ \frac{\left\{ \begin{pmatrix} \text{solder ball diameter} \end{pmatrix} - \begin{pmatrix} \text{solder thickness} \\ \text{after wet spread} \end{pmatrix} \right\}}{(\text{solder ball diameter})} \right] \times 100. \quad \text{(II)}$$

Further, in this embodiment, when the bonding layer 60 formed on the rear surface 223 has a thickness of 100 μm, a melt viscosity at 223° C. thereof may be preferably in the range of about 10 to 10,000 Pa·s, more preferably in the range of about 50 to 5,000 Pa·s, and even more preferably in the range of about 300 to 1,500 Pa·s. By setting the melt viscosity of the bonding layer 60 to fall within such a range, it is possible to prevent a reduction in connection reliability which would occur as the bonding layer 60 is bled from bonded objects, i.e., the first and second semiconductor wafers 210 and 220, during a heating operation, and to restrain the bonding layer 60 from contaminating neighboring members. In addition, it is possible to prevent generation of air bubbles in the bonding layer 60 and occurrence of defects such as insufficient filling of the cured product of the thermosetting resin in the gap between the first and second semiconductor wafers 210 and 220. Moreover, it is possible to prevent the molten solder bumps 224 (or molten solders) from being excessively wet spread, which would lead to a problem of short-circuiting the adjacent connector portions 212 and 222. It is also possible to avoid occurrence of defective bonding between the connector portions 212 and 222, because the thermosetting resin present between the solder bumps 224 and the connector portions 212 is removed when metallically bonding the connector portions 212 and 222 through the joint portions 225 formed from the solidified products of the solder bumps 224.

In this regard, it is to be noted that the melt viscosity of the bonding layer 60 is measured using the following measurement method. In other words, the bonding layer 60 having a thickness of 100 μm is measured using a viscoelasticity measuring instrument (produced by JASCO International Co., Ltd.) at a temperature increasing rate of 30° C./min and a frequency of 1.0 Hz under a strain-constant stress sensing condition. The melt viscosity of the bonding layer 60 can be obtained by measuring a viscosity thereof at an atmospheric temperature of 223° C., which is a melting point of a 96.5Sn/3.5Ag alloy.

[1A-3] Next, as shown in FIG. 3C, the first semiconductor wafer 210 and the second semiconductor wafer 220 having the bonding layer 60 formed on the rear surface 223 thereof are put in a face-to-face relationship with each other so that the functional surface 211 can be opposed to the rear surface 223. That is to say, the first and second semiconductor wafers 210 and 220 are brought into a face-to-face relationship in a state that the bonding layer 60 lies between the functional surface 211 and the rear surface 223.

The first and second semiconductor wafers 210 and 220 are positioned together so that the ends of the connector portions 212 located on the side of the functional surface 211 correspond to the solder bumps 224 located on the side of the rear surface 223. Thereafter, as shown in FIG. 3D, the first and second semiconductor wafers 210 and 220 are brought into contact with each other through the bonding layer 60, thereby producing a semiconductor wafer stacked body 230 in which the first and second semiconductor wafers 210 and 220 are stacked together (second process).

[1A-4] Next, as shown in FIG. 3D, the semiconductor wafer stacked body 230 is compressed in a thickness direction thereof while heating the same (third process).

At this time, it is preferred that the heating is carried out so that the thermosetting resin can be completely cured subsequent to melting of the solder bumps 224.

More specifically, a heating temperature is preferably in the range of about 100 to 250° C., and more preferably in the range of about 130 to 230° C., although it may slightly vary with the kinds of the constituent materials of the solder bumps 224 and the bonding layer 60.

This makes it possible for the flux-active curing agent to reduce the surfaces of the solder bumps 224, and to melt the solder component constituting the solder bumps 224. As a result, the molten solder bumps 224 are aggregated between the connector portions 212 and 222 in the bonding layer 60. Thereafter, the molten solder bumps 224 are solidified. As a result, the connector portions 212 and 222 can be electrically connected together though the joint portions 225 formed from the solidified products of the molten solder bumps 224.

Further, since the curing of the thermosetting resin is completed after the solder bumps 224 have been melted, the insulating portion 226 composed from the cured product of the thermosetting resin can be formed in a region between the first and second semiconductor wafers 210 and 220 other than regions where the molten solder bumps 224 are aggregated. This makes it possible to electrically insulate the adjacent joint portions 225 in a reliable manner, and to reliably bond (or fix) the first and second semiconductor wafers 210 and 220 together.

In the manner described above, the solder bumps 224 are melted and solidified, and the thermosetting resin is cured. As a result, the first and second semiconductor wafers 210 and 220 are fixed together through the bonding layer 60'. Thus, it is possible to produce a semiconductor wafer bonded body 240 in which the connector portions 212 and 222 are electrically connected together through the joint portions 225 composed from the solidified products of the molten solder bumps 224.

Here, with the present invention, the connector portions 212 and 222 are electrically connected together through solidified products such as the joint portions 225 or the like. Thanks to this feature, it is possible to reliably prevent breakage of the electrical connection between the connector portions 212 and 222 even when the insulating portion 226 composed from the cured product of the thermosetting resin are expanded by heat generated from the semiconductor chip(s) 20 during operation of the semiconductor device 10 which will be described below. This makes it possible to obtain stable conduction between the connector portions 212 and 222. In other words, it becomes possible to electrically connect the connector portions 212 and 222 together in excellent connection reliability.

A thicknesses of each joint portion 225, i.e., a thickness (an average thickness) of the bonding layer 60' in the semiconductor wafer bonded body 240 is not particularly limited to a specific value, but may be preferably in the range of about 3 to 200 μm, and more preferably in the range of about 5 to 150 μm. By reducing a spaced-apart distance between the first and second semiconductor wafers 210 and 220 in this manner, it is possible to reduce thicknesses of the semiconductor chips 20 obtained, by dicing the semiconductor wafer bonded body 240. As a result, it becomes possible to reduce an overall thickness of the semiconductor device 10 provided with the semiconductor chip(s) 20, and to make the semiconductor device 10 lightweight.

In other words, it is possible to increase an integration density of the semiconductor chips 20 included in a single semiconductor device (or a single semiconductor package) 10, and to reduce an overall size of the semiconductor device 10. Further, since a spaced-apart distance between the electrodes provided on the respective functional surfaces 211 and 221 can be made small, it is possible to increase an amount of information stored in a single semiconductor device 10.

<Second Method for Bonding Semiconductor Wafers>

Next, description will be made on the method for producing the semiconductor wafer bonded body 240 using the second method for bonding semiconductor wafers.

Figure 4:
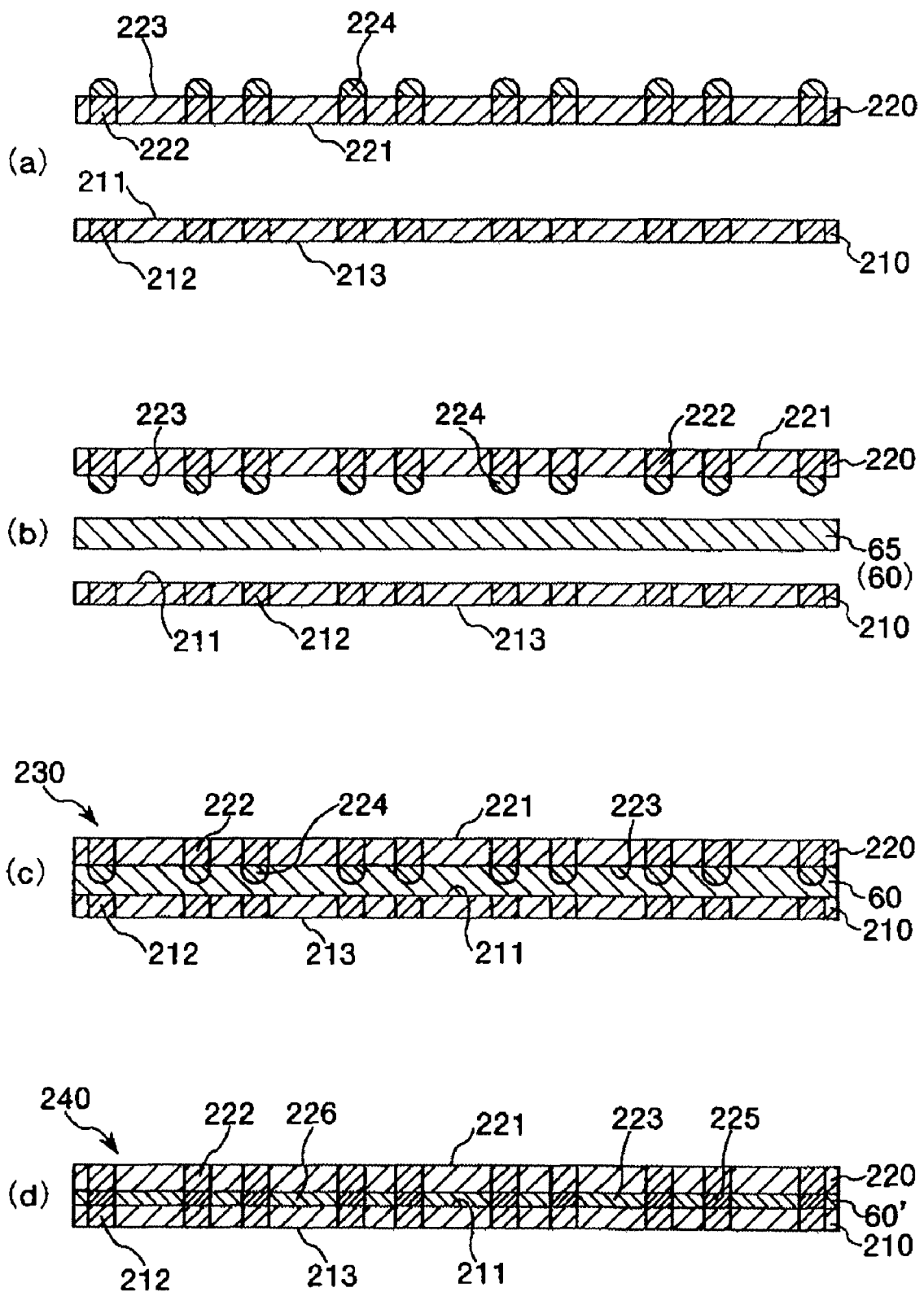
FIGS. 4A to 4D are vertical section views for explaining a second method for bonding semiconductor wafers.

[1B-1] First, as shown in FIG. 4A, a first semiconductor wafer 210 and a second semiconductor wafer 220 are prepared in the same manner as in the above process [1A-1] described above (first process).

[1B-2] Next, a bonding sheet 65 containing a flux-active curing agent and a thermosetting resin as constituent materials thereof is prepared. Thereafter, as shown in FIG. 4B, the bonding sheet 65 is interposed between the first semiconductor wafer 210 and the second semiconductor wafer 220 arranged so that the functional surface 211 and the rear surface 223 can be opposed to each other.

The same materials as described in connection with the above process [1A-2] can be used as the constituent materials such as the flux-active curing agent and the thermosetting resin contained in the bonding sheet 65.

Further, it is preferred that the bonding sheet 65 further contains a film-forming resin as the constituent materials thereof in addition to the flux-active curing agent and the thermosetting resin. Use of the film-forming resin makes it possible to reliably form the bonding sheet 65 into a film shape.

Examples of the film-forming resin include (meth)acrylic resin, phenoxy resin, polyester resin, polyurethane resin, polyimide resin, cyclohexane-modified polyimide resin, polybutadiene, polypropylene, styrene—butadiene—styrene copolymer, styrene—ethylene—butylene—styrene copolymer, polyacetal resin, polyvinyl butyral resin, polyvinyl acetal resin, butyl rubber, chloroprene rubber, polyamide resin, acrylonitrile—butadiene copolymer, acrylonitrile—butadiene—acrylic acid copolymer, acrylonitrile—butadiene—styrene copolymer, polyvinyl acetate, nylon, and the like, one or more of which may be used independently or in combination.

The term "(meth)acrylic resin" used herein refers to a polymer of (meth)acrylic acids and derivatives thereof, or a copolymer of (meth)acrylic acids, derivative thereof and other monomers. In this regard, the expression "(meth)acrylic acid or the like" used herein denotes acrylic acid or methacrylic acid.

Specifically, examples of the (meth)acrylic resin include polyacrylic acid, polymethacrylic acid, polyacrylic esters such as polymethyl acrylate, polyethyl acrylate, polybutyl acrylate and poly-2-ethyl hexyl acrylate, polymethacrylates such as polymethyl methacrylate, polyethyl methacrylate and polybutyl methacrylate, polyacrylonitrile, polymethacrylonitrile, polyacrylamide, butyl acrylate—ethyl acrylate—acrylonitrile copolymer, acrylonitrile—butadiene copolymer, acrylonitrile—butadiene—acrylic acid copolymer, acrylonitrile—butadiene—styrene copolymer, acrylonitrile—styrene copolymer, methyl methacrylate—styrene copolymer, methyl methacrylate—acrylonitrile copolymer, methyl methacrylate—α-methyl styrene copolymer, butyl acrylate—ethyl acrylate—acrylonitrile-2-hydroxyethyl methacrylate—methacrylic acid copolymer, butyl acrylate—ethyl acrylate—acrylonitrile-2-hydroxyethyl methacrylate—acrylic acid copolymer, butyl acrylate—acrylonitrile-2-hydroxyethyl methacrylate copolymer, butyl acrylate—acrylonitrile—acrylic acid copolymer, butyl acrylate—ethyl acrylate—acrylonitrile copolymer, ethyl acrylate—acrylonitrile—N,N-dimethyl acrylamide copolymer, and the like. Among them, the butyl acrylate—ethyl acrylate—acrylonitrile copolymer and the ethyl acrylate—acrylonitrile—N,N-dimethyl acrylamide copolymer are preferably used.

Use of the (meth)acrylic resin obtained by copolymerizing monomers having a functional group such as a nitrile group, an epoxy group, a hydroxyl group or a carboxyl group makes it possible to improve the adhesion between the bonding sheet 65 (or the bonding layer 60) and the first and second semiconductor wafers 210 and 220, and to enhance compatibility thereof with the thermosetting resin or the like. An amount of the monomers used in the (meth)acrylic resin is not particularly limited to a specific value, but may be preferably in the range of about 0.1 to 50 mol %, more preferably in the range of about 0.5 to 45 mol %, and even more preferably in the range of about 1 to 40 mol %, based on a total amount of the (meth)acrylic resin. By setting the amount of the monomers to fall within such a range, it is possible to improve the adhesion of the bonding sheet 65 (or the bonding layer 60) to the first and second semiconductor wafers 210 and 220, and to reliably prevent an adhesive force of the bonding sheet 65 from becoming too great, which assists in enhancing workability of the bonding sheet 65.

A weight average molecular weight of the (meth)acrylic resin is not particularly limited to a specific value, but may be preferably 100,000 or more, more preferably in the range of about 150,000 to 1,000,000, and even more preferably in the range of about 250,000 to 900,000. By setting the weight average molecular weight of the (meth)acrylic resin to fall within the above range, it is possible to improve a film formation property of the bonding sheet 65.

In the case where the phenoxy resin is used as the film-forming resin, a number average molecular weight thereof is preferably in the range of about 5,000 to 15,000. Use of the phenoxy resin having such a number average molecular weight makes it possible to reduce flowability of the bonding layer 60, and to keep the thickness of the bonding layer 60 uniform.

Examples of a chemical structure of the phenoxy resin include, but are not particularly limited to, a bisphenol A type chemical structure, a bisphenol F type chemical structure and a biphenyl type chemical structure. Among them, it is preferable to use a phenoxy resin having a saturated absorption rate of 1% or less. This makes it possible to suppress occurrence of foaming or peeling attributable to the bonding layer 60, even though the phenoxy resin is exposed to a high temperature condition when producing the semiconductor wafer bonded body 240 or mounting the semiconductor chip(s) 20 onto the interposer 30.

In this regard, it is to be noted that the saturated absorption rate is calculated by forming the phenoxy resin into a film having a thickness of 25 μm, drying the film (into an absolutely dried state) for one hour in an atmosphere of 100° C., leaving the film alone in a constant-temperature high-humidity reservoir kept in an atmosphere of 40° C. and 90% RH, measuring change in weight every 24 hour, and finding the weight at the time when the change in weight is saturated. Using the weight at the saturated time, the saturated absorption rate can be calculated by the following equation (III):

$$\text{saturated absorption rate (\%)} = \frac{\left\{ \begin{array}{l} \text{(weight at saturated time)} - \\ \text{(weight at absolutely dried time)} \end{array} \right\}}{\text{(weight at absolutely dried time)}} \times 100. \quad \text{(III)}$$

Further, in the case where the polyimide resin is used as the film-forming resin, it is preferable for the polyimide resin to have an imide bond in one repeating unit thereof.

Examples of such a polyimide resin include a polymer obtained by reacting diamine and acid dianhydride with each other to synthesize polyamide acid, and then heating the polyamide acid to dehydrate and ring-close it. Examples of the diamine include: aromatic diamines such as 3,3'-dimethyl-4,4'-diamino diphenyl, 4,6-dimethyl-m-phenylenediamine, 2,5-dimethyl-p-phenylenediamine; siloxanediamines such as 1,3-bis(3-aminopropyl)-1,1,3,3-tetramethyl disiloxane; and the like, one or more of which may be used independently or in combination.

Further, examples of the acid dianhydride include 3,3,4,4'-biphenyl tetracarboxylic acid, pyromellitic acid dianhydride, 4,4'-oxydiphthalic acid dianhydrate, and the like.

In this regard, it is to be noted that such a polyimide resin may be either soluble or insoluble to a solvent which will be described below, although the soluble one is preferred. The polyimide resin soluble to the solvent shows increased mutual solubility with respect to the constituent materials contained in the liquid material 61, which makes it easy to handle the polyimide resin. In particular, it is preferable to use a siloxane-modified polyimide resin which can be dissolved in many different solvents.

Further, the film-forming resin may be a commercially available one. Additives such as various kinds of plasticizers, a stabilizing agent, an inorganic filler, an antistatic agent and a pigment may be mixed with the bonding sheet 65 to an extent that does not mar effects provided by the present invention.

An amount of the film-forming resin contained in the bonding sheet 65 is preferably in the range of about 5 to 45 wt %, based on the total amount of the constituent materials of the bonding sheet 65. By setting the amount of the film-forming resin to fall within such a range, it is possible to suppress an increase in an elastic modulus of the insulating portion 226 while inhibiting a decrease in the film formation property of the bonding sheet 65. This makes it possible to further improve the adhesion between the bonding layer 60' and the first and second semiconductor wafers 210 and 220, and to suppress an increase in a melt viscosity of the bonding sheet 65.

Such a bonding sheet 65 can be produced by, e.g., dissolving the flux-active curing agent, the thermosetting resin, if desired, the film-forming resin, and other components into the solvent to prepare a bonding sheet formation material (or a liquid material), applying the bonding sheet formation material on a release-treated base member such as a polyester sheet or the like, removing the solvent from the bonding sheet formation material at a predetermined temperature, and then drying the same.

In this regard, it is to be noted that the solvent used at this time may be the same one as described in connection with the above process [1A-2].

Further, a thickness (an average thickness) of the bonding sheet 65 is not particularly limited to a specific value, but may be preferably in the range of about 5 to 300 μm, and more preferably in the range of about 10 to 200 μm.

[1B-3] Next, the first and second semiconductor wafers 210 and 220 are positioned together so that the ends of the connector portions 212 located on the side of the functional surface 211 correspond to the solder bumps 224 located on the side of the rear surface 223. As shown in FIG. 4C, the first and second semiconductor wafers 210 and 220 are brought into contact with each other through the bonding layer 60 (or the bonding sheet 65), thereby producing a semiconductor wafer stacked body 230 in which the first and second semiconductor wafers 210 and 220 are stacked together (second process).

[1B-4] Next, in the same manner as in the above process [1A-4], the semiconductor wafer stacked body 230 is compressed in a thickness direction thereof while heating the same. This produces a semiconductor wafer bonded body 240 as shown in FIG. 4D.

<Third Method for Bonding Semiconductor Wafers>

Next, description will be made on the method for producing the semiconductor wafer bonded body 240 using the third method for bonding semiconductor wafers.

[1C-1] First, a first semiconductor wafer 210 and a second semiconductor wafer 220 each having a plurality of each circuit portions not shown in the drawings are prepared (first process).

Figure 5:
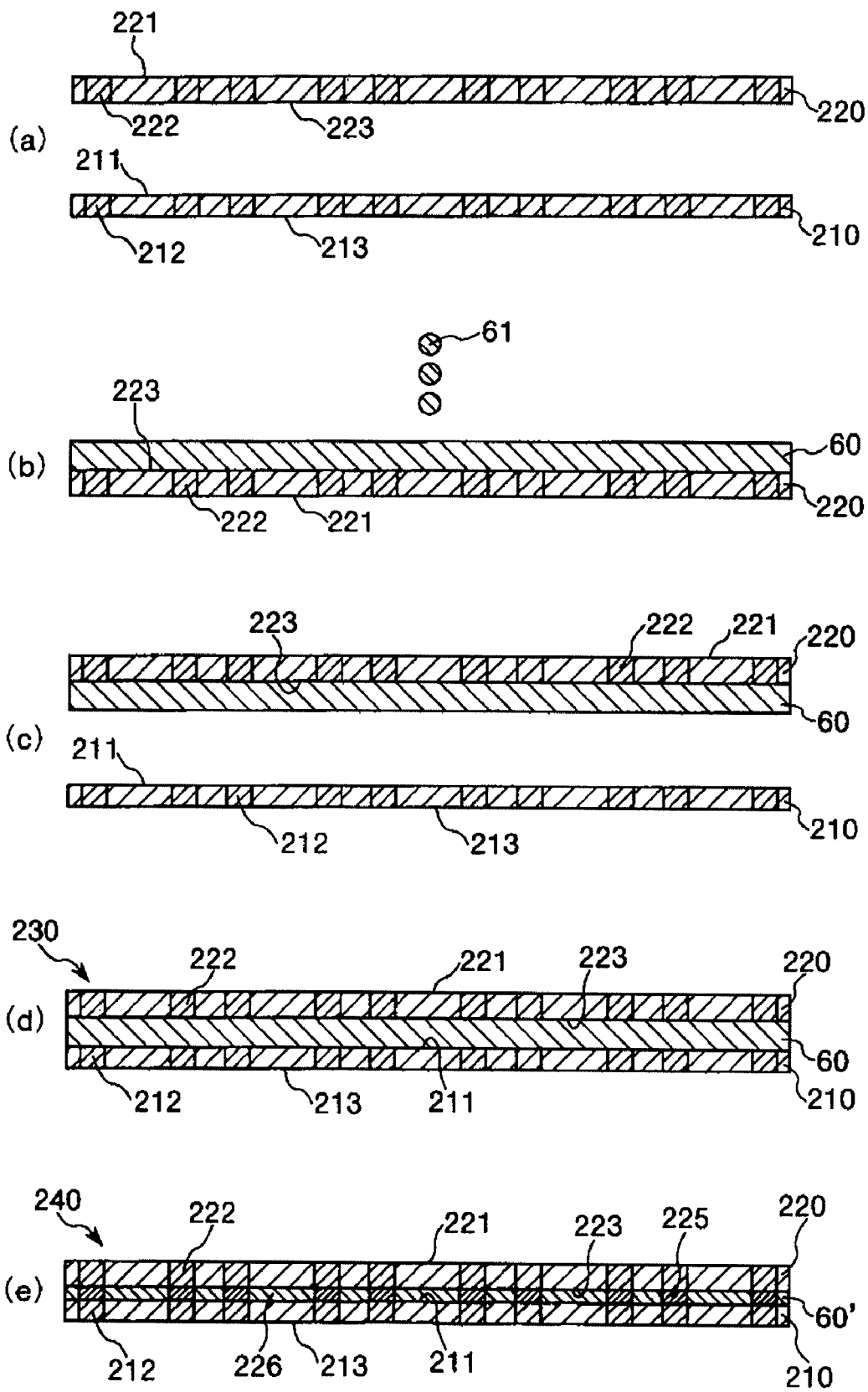
FIGS. 5A to 5E are vertical section views for explaining a third method for bonding semiconductor wafers.

In this embodiment, as shown in FIG. 5A, each of the first and second semiconductor wafers 210 and 220 includes a plurality of electrodes (not shown) provided on the functional surface 211 or 221 thereof and connected to the each circuit portions, and a plurality of connector portions (or conductive posts) 212 or 222 provided so as to extend through each of the first and second semiconductor wafers 210 and 220 in a thickness direction thereof and electrically connected to the electrodes.

[1C-2] Next, as shown in FIG. 5B, a liquid material 61 containing a flux-active curing agent, a thermosetting resin and solder powder as constituent materials thereof is applied on the rear surface 223 of the second semiconductor wafer 220, thereby forming a bonding layer 60.

The same method as described in connection with the above process [1A-2] can be used in applying the liquid material 61 on the rear surface 223.

In this regard, it is to be noted that the bonding layer 60 is formed by applying the liquid material 61 on the rear surface 223, and then removing a solvent contained in the liquid material 61, namely drying the liquid material 61.

The liquid material 61 may be dried either naturally or artificially, e.g., by heating the second semiconductor wafer 220 with a heater or the like.

Further, if necessary, the bonding layer 60 may be subjected to a temporary curing treatment. This makes it possible to reliably keep a shape of the bonding layer 60 thus formed.

In this embodiment, the bonding layer 60 is provided only on the rear surface 223 of the second semiconductor wafer 220. Alternatively, the bonding layer(s) 60 may be provided only on the functional surface 211 of the first semiconductor wafer 210 or on both the rear surface 223 of the second semiconductor wafer 220 and the functional surface 211 of the first semiconductor wafer 210. From the viewpoint of simplifying the processes in the method for bonding semiconductor wafers, it is preferred that the bonding layer 60 is provided on one of the rear surface 223 and the functional surface 211. On the other hand, from the standpoint of enhancing adhesion between the first and second semiconductor wafers 210 and 220 in the semiconductor wafer bonded body 240 produced, it is preferred that the bonding layers 60 are formed on both the rear surface 223 and the functional surface 211.

The flux-active curing agent serves to reduce surfaces of solder particles of the solder powder when heating and compressing a semiconductor wafer stacked body 230 in a process [1C-4] which will be described below. This makes it possible to increase wettability of a solder component constituting the solder powder, and to promote self-organization of molten solder powder. As a result, the connector portions 212 and 222 can be connected through the joint portions 225 formed from solidified products of the molten solder powder, which makes it possible to reliably obtain conduction between the connector portions 212 and 222 through the joint portions 225.

Further, it is preferred that the flux-active curing agent has a functional group bondable to the thermosetting resin. Thus, the flux-active curing agent serves as a curing agent when thermally curing the thermosetting resin and is bonded to the thermosetting resin. As a result, it is possible to appropriately suppress occurrence of ion migration which would be caused by flux component residues in the bonding layer 60' of the semiconductor wafer bonded body 240 produced. Furthermore, the bonding of the flux-active curing agent to the thermosetting resin also provides an effect of increasing an elastic modulus and/or a glass transition temperature (Tg) of a cured product of the thermosetting resin.

Taking the above facts into account, it is preferred that a curing agent having a carboxyl group and/or a phenolic hydroxyl group is used as the flux-active curing agent. The same curing agent as described in connection with the above process [1A-2] can be used as the flux-active curing agent.

In this regard, it is to be noted that the flux-active curing agent having a carboxyl group and/or a phenolic hydroxyl group is three-dimensionally introduced into the cured product of the thermosetting resin such as the epoxy resin or the like by reaction therewith.

From the viewpoint of promoting formation of three-dimensional networks of the cured product of the epoxy resin, it is preferred that the flux-active curing agent contains, in one molecule thereof, at least two phenolic hydroxyl groups which can be bonded to the epoxy resin and at least one carboxyl group which is directly bonded to an aromatic ring showing a flux action (or a reducing action) with respect to the solder powder.

Examples of such a flux-active curing agent include: benzoic acid derivatives such as 2,3-dihydroxybenzoic acid, 2,4-dihydroxybenzoic acid, gentistic acid (2,5-dihydroxybenzoic acid), 2,6-dihydroxybenzoic acid, 3,4-dihydroxybenzoic acid and gallic acid (3,4,5-trihydroxybenzoic acid); naphthoic acid derivatives such as 1,4-dihydroxy-2-naphthoic acid, 3,5-dihydroxy-2-naphthoic acid and 3,7-dihydroxy-2-naphthoic acid; phenol phthalin; diphenolic acid; and the like, one or more of which may be used independently or in combination.

Further, an amount of the flux-active curing agent contained in the bonding layer 60 is preferably in the range of about 1 to 30 wt %, and more preferably in the range of about 3 to 25 wt %, based on a total amount of the constituent materials of the bonding layer 60 excluding the solder powder. This makes it possible to enhance the flux activity in the bonding layer 60, and to prevent the flux-active curing agent from remaining unreacted with the thermosetting resin in the bonding layer 60' of the semiconductor wafer bonded body 240, thereby appropriately inhibiting occurrence of ion migration which would be caused by the residual flux-active curing agent.

Furthermore, the flux-active curing agent may exist outside the solder particles of the solder powder in the bonding layer 60. For example, the solder particles of the solder powder and the flux-active curing agent may be dispersed into the thermosetting resin. Alternatively, the flux-active curing agent may adhere to the surfaces of the solder particles of the solder powder dispersed in the thermosetting resin. Since the flux-active curing agent exists outside the solder particles of the solder powder, it can efficiently move toward interfaces between the solder particles of the solder powder and surfaces of the connector portions 212 and 222 to bring them into direct contact with each other in a process [1C-4] which will be described below. As a result, it is possible to enhance connection reliability between the connector portions 212 and 222 and the joint portions 225.

In the semiconductor wafer bonded body 240 obtained in the subsequent process [1C-4], the thermosetting resin serves to insulate the adjacent joint portions 225 by an insulating portion 226 composed from the cured product of the thermosetting resin, and to fix (or bond) the first and second semiconductor wafers 210 and 220 together.

The same thermosetting resin as described in connection with the above process [1A-2] can be used as the thermosetting resin.

Further, an amount of the thermosetting resin contained in the bonding layer 60 is preferably in the range of about 25 to 90 wt %, and more preferably in the range of about 35 to 80 wt %, based on the total amount of the constituent materials of the bonding layer 60 excluding the solder powder. This makes it possible to obtain superior curability of the thermosetting resin when curing it, and to design good melting behavior of the bonding layer 60.

In addition, it is also preferred that a curing agent other than the flux-active curing agent (hereinafter simply referred to as "curing agent") is added to the thermosetting resin. This makes it possible to further enhance the curability of the thermosetting resin.

The same curing agent as described in connection with the above process [1A-2] can be used as the curing agent.

Further, other constituent materials than the flux-active curing agent and the thermosetting resin may be appropriately added to the bonding layer 60, examples of which include a coupling agent, a flux activator for increasing the activity of the flux-active curing agent and various kinds of additives for improving different properties such as resin compatibility, stability and workability.

Use of such a coupling agent makes it possible to further increase the adhesion of the bonding layer 60 to the first and second semiconductor wafers 210 and 220.

The same coupling agent as described in connection with the above process [1A-2] can be used as the coupling agent.

An amount of the coupling agent contained in the bonding layer 60 is preferably in the range of about 0.01 to 5 wt %, based on the total amount of the constituent materials of the bonding layer 60 excluding the solder powder.

The solder particles of the solder powder are melted when heating and compressing the semiconductor wafer stacked body 230 in the subsequent process [1C-4], and the molten solder particles are aggregated between the connector portions 212 and 222 in the bonding layer 60. Solidified products of the molten solder particles form the joint portions 225 to electrically connect the connector portions 212 and 222 together.

It is preferred that a constituent material of the solder powder is an alloy containing two or more metals selected from the group comprising tin (Sn), silver (Ag), bismuth (Bi), indium (In), zinc (Zn), lead (Pb) and copper (Cu). In terms of a melting temperature and mechanical properties of the solder powder, it is particularly preferable to use a Sn-containing alloy such as a Sn—Pb alloy, a Sn—Bi alloy, a Sn—Ag alloy, a Sn—Ag—Cu alloy or a Sn—In alloy.

An average particle size of the solder particles of the solder powder may be suitably set depending on surface areas of the first and second semiconductor wafers 210 and 220 and a spaced-apart distance therebetween (namely, a thickness of the bonding layer 60). The average particle size of the solder particles of the solder powder is preferably in the range of about 1 to 100 µm, more preferably in the range of about 5 to 100 µm, and even more preferably in the range of about 10 to 50 µm. By setting the average particle size of the solder particles of the solder powder to fall within such a range, it is possible to reliably gather (aggregate) the molten particles (solder components) of the solder powder on the surfaces of the connector portions 212 and 222. In addition, it is possible to restrain the adjacent connector portions 212 and 222 from being bridged (or connected), and to prevent the adjacent connector portions 212 and 222 from being short-circuited.

The average particle size of the solder particles of the solder powder can be measured using, e.g., a laser diffraction scattering method.

In general, a melting point of the solder powder is preferably in the range of about 100 to 250° C., and more preferably in the range of about 130 to 230° C. This makes it possible to sufficiently secure flowability of the thermosetting resin and the like contained in the bonding layer 60 before being cured, and to reliably prevent thermal degradation of the each circuit portions formed on the first and second semiconductor wafers 210 and 220.

Further, it is preferred that the constituent material of the solder powder has a melting temperature lower than a curing temperature of the thermosetting resin. This makes it possible for the molten solder particles of the solder powder to reliably be aggregated on the surfaces of the connector portions 212 and 222.

In this regard, it is to be noted that the melting point of the solder powder is defined by an endothermic peak temperature thereof measured using, e.g., a DSC (Differential Scanning Calorimetry) method, at a temperature increasing rate of 10° C./min.

An amount of the solder powder contained in the bonding layer 60 is preferably in the range of about 20 to 250 parts by weight, more preferably in the range of about 40 to 230 parts by weight, and even more preferably in the range of about 50 to 160 parts by weight, based on 100 parts by weight of the total amount of the constituent materials of the bonding layer 60 excluding the solder powder. By setting the amount of the solder powder to fall within such a range, it is possible to reliably form the joint portions 225 from the solidified products of the molten solder particles of the solder powder. As a result, the connector portions 212 and 222 can be electrically connected together through the joint portions 225 in a reliable manner. In addition, the insulating portion 226 is formed from the cured product of the thermosetting resin, which makes it possible to reliably insulate the adjacent joint portions 225.

Further, the same solvent as described in connection with the above process [1A-2] can be used as the solvent contained in the liquid material 61.

An amount of the solvent contained in the liquid material 61 is preferably set in such a range that an amount of solid components to be mixed in the solvent (namely, the total amounts of the constituent materials of the above described bonding layer 60) becomes equal to about 10 to 60 wt %.

In this regard, it is preferred that the bonding layer 60 formed on the rear surface 223 using the liquid material 61 containing the flux-active curing agent, the thermosetting resin, and the like has the following properties.

More specifically, in the case where the bonding layer 60 formed on the rear surface 223 has a thickness of 100 µm, a melt viscosity at 138° C. thereof may be preferably in the range of about 0.01 to 10,000 Pa·s, more preferably in the range of about 0.1 to 3,000 Pa·s, and even more preferably in the range of about 0.3 to 1,000 Pa·s. By setting the melt viscosity of the bonding layer 60 to fall within such a range, it is possible to prevent a reduction in connection reliability which would occur as the bonding layer 60 is bled from bonded objects, i.e., the first and second semiconductor wafers 210 and 220, during a heating operation, and to restrain the bonding layer 60 from contaminating neighboring members. In addition, it is possible to prevent generation of air bubbles in the bonding layer 60 and occurrence of defects such as insufficient filling of the cured product of the thermosetting resin in the gap between the first and second semiconductor wafers 210 and 220. Moreover, it is possible to prevent the molten solder particles of the solder powder (or solders) from being excessively wet spread, which would lead to a problem of short-circuiting the adjacent connector portions 212 and 222. It is also possible to avoid occurrence of defective bonding between the connector portions 212 and 222, because the thermosetting resin and the solder powder are prevented from remaining in the joint portions 225 and the insulating portion 226, respectively, when metallically bonding the connector portions 212 and 222 through the joint portions 225 formed from the solidified products of the molten solder particles of the solder powder.

In this regard, it is to be noted that the melt viscosity of the bonding layer 60 is measured by the following measurement method. In other words, the bonding layer 60 having a thickness of 100 μm is measured using a viscoelasticity measuring instrument (produced by JASCO International Co., Ltd.) at a temperature increasing rate of 30° C./min and a frequency of 1.0 Hz under a strain-constant stress sensing condition. The melt viscosity of the bonding layer 60 can be obtained by measuring a viscosity thereof at an atmospheric temperature of 223° C., which is a melting point of a 96.5Sn/3.5Ag alloy.

The thickness of the bonding layer 60 is not particularly limited to a specific value, but may be preferably in the range of about 3 to 300 μm, more preferably in the range of about 10 to 200 μm, and even more preferably in the range of about 15 to 150 μm. By setting the thickness of the bonding layer 60 to fall within such a range, it is possible for the insulating portion 226 to have a great enough thickness and to have increased mechanical strength.

[1C-3] Next, as shown in FIG. 5C, the first semiconductor wafer 210 and the second semiconductor wafer 220 having the bonding layer 60 formed on the rear surface 223 thereof are put in a face-to-face relationship with each other so that the functional surface 211 can be opposed to the rear surface 223. That is to say, the first and second semiconductor wafers 210 and 220 are brought into a face-to-face relationship in a state that the bonding layer 60 lies between the functional surface 211 and the rear surface 223.

The first and second semiconductor wafers 210 and 220 are positioned together so that the ends of the connector portions 212 located on the side of the functional surface 211 correspond to the ends of the connector portions 222 located on the side of the rear surface 223. Thereafter, as shown in FIG. 5D, the first and second semiconductor wafers 210 and 220 are brought into contact with each other through the bonding layer 60, thereby producing a semiconductor wafer stacked body 230 in which the first and second semiconductor wafers 210 and 220 are stacked together (second process).

[1C-4] Next, as shown in FIG. 5D, the semiconductor wafer stacked body 230 is compressed in a thickness direction thereof while heating the same (third process).

At this time, it is preferred that the heating is carried out slowly so that the thermosetting resin can be completely cured subsequent to melting of the solder powder.

More specifically, a heating temperature is preferably in the range of about 100 to 250° C., and more preferably in the range of about 130 to 230° C., although it may slightly vary with the kinds of the constituent materials of the solder powder and the bonding layer 60.

This makes it possible for the flux-active curing agent to reduce the surfaces of the solder particles of the solder powder, and to melt the solder component of the solder powder. As a result, the molten solder particles of the solder powder move self-aligningly toward the surfaces of the connector portions 212 and 222 in the bonding layer 60. Therefore, the molten solder particles of the solder powder are self-aligned and aggregated between the connector portions 212 and 222. Thereafter, the molten particles aggregated are solidified to form the joint portions 225 through which the connector portions 212 and 222 can be electrically connected together.

Further, since the curing of the thermosetting resin occurs after the solder powder has been melted, the insulating portion 226 composed from the cured product of the thermosetting resin can be formed in a region between the first and second semiconductor wafers 210 and 220 other than regions where the molten solder particles of the solder powder are aggregated. This makes it possible to electrically insulate the adjacent joint portions 225 in a reliable manner, and to reliably bond (or fix) the first and second semiconductor wafers 210 and 220 together.

In the manner described above, the molten solder particles of the solder powder are aggregated and then solidified while curing the thermosetting resin. As a result, the first and second semiconductor wafers 210 and 220 are fixed together through the bonding layer 60'. Thus, it is possible to produce a semiconductor wafer bonded body 240 in which the connector portions 212 and 222 are electrically connected together through the joint portions 225 composed from the solidified products of the molten solder particles of the solder powder.

In this regard, it is to be noted that the semiconductor wafer stacked body 230 can be heated at a predetermined single temperature. Alternatively, it may be possible to perform a stepwise curing process in which the semiconductor wafer stacked body 230 is heated at 150° C. for 100 seconds and then heated at 200° C. for 100 seconds or a post-compression curing process in which the semiconductor wafer stacked body 230 is heat-compressed at 180° C. for 10 seconds and then cured at 200° C. for 10 minutes within an oven. Thus, the joint portions 225 and the connector portions 212 and 222 are electrically connected together in a reliable manner by metallic bond between the solder particles of the solder powder and the connector portions 212 and 222. This makes it possible to form joint portions 225 with reduced connection resistance and enhanced connection reliability.

Further, by compressing the semiconductor wafer stacked body 230 in the thickness direction thereof while heating the same, it is possible for the molten solder particles of the solder powder to flow under pressure, and to efficiently move toward the surfaces of the connector portions 212 and 222.

More specifically, a pressure in compressing the semiconductor wafer stacked body 230 is preferably in the range of about 0 to 20 MPa, and more preferably in the range of about 1 to 10 MPa. By setting the pressure to fall within such a range, it is possible for the molten solder particles of the solder powder to be reliably aggregated between the connector portions 212 and 222.

In this regard, it is to be noted that even if the pressure artificially applied to the semiconductor wafer stacked body 230 is 0 MPa, a predetermined pressure may be applied to the bonding layer 60 due to a weight of the second semiconductor wafer 220 itself.

Here, with the present invention, the connector portions 212 and 222 are electrically connected together through solidified products such as the joint portions 225 or the like. Thanks to this feature, it is possible to reliably prevent breakage of the electrical connection between the connector portions 212 and 222 even when the insulating portion 226 composed from the cured product of the thermosetting resin are expanded by heat generated from the semiconductor chip(s) 20 during operation of the semiconductor device 10 which will be described below. This makes it possible to obtain stable conduction between the connector portions 212 and 222. In other words, it becomes possible to electrically connect the connector portions 212 and 222 together in excellent connection reliability.

A thicknesses of each joint portion 225, i.e., a thickness (an average thickness) of the bonding layer 60' in the semiconductor wafer bonded body 240 is not particularly limited to a specific value, but may be preferably in the range of about 3 to 300 μm, and more preferably in the range of about 5 to 150 μm. By reducing a spaced-apart distance between the first and second semiconductor wafers 210 and 220 in this manner, it is possible to reduce thicknesses of the semiconductor chips 20 obtained by dicing the semiconductor wafer bonded body 240. As a result, it becomes possible to reduce an overall thickness of the semiconductor device 10 provided with the semiconductor chip(s) 20, and to make the semiconductor device 10 lightweight.

In other words, it is possible to increase an integration density of the semiconductor chips 20 included in a single semiconductor device (or a single semiconductor package) 10, and to reduce an overall size of the semiconductor device 10. Further, since a spaced-apart distance between the electrodes provided on the respective functional surfaces 211 and 221 can be made small, it is possible to increase an amount of information stored in a single semiconductor device 10.

<Fourth Method for Bonding Semiconductor Wafers>

Next, description will be made on the method for producing the semiconductor wafer bonded body 240 using the fourth method for bonding semiconductor wafers.

Figure 6:
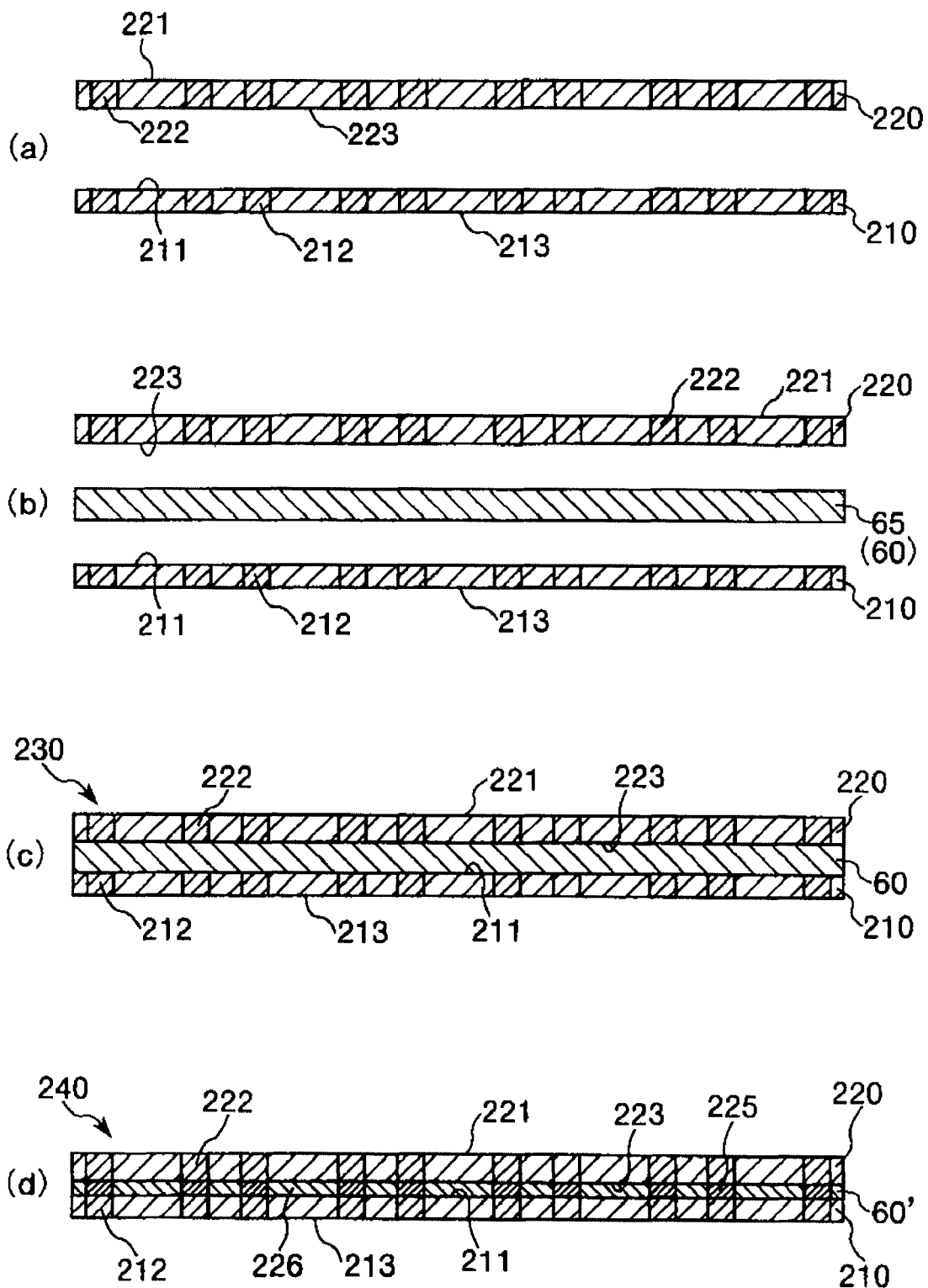
FIGS. 6A to 6D are vertical section views for explaining a fourth method for bonding semiconductor wafers.

[1D-1] First, as shown in FIG. 6A, a first semiconductor wafer 210 and a second semiconductor wafer 220 are prepared in the same manner as in the above process [1C-1] described above (first process).

[1D-2] Next, a bonding sheet 65 containing a flux-active curing agent, a thermosetting resin and solder powder as constituent materials thereof is prepared. Thereafter, as shown in FIG. 6B, the bonding sheet 65 is interposed between the first semiconductor wafer 210 and the second semiconductor wafer 220 arranged so that the functional surface 211 and the rear surface 223 can be opposed to each other.

The same materials as described in connection with the above process [1A-2] can be used as the constituent materials such as the flux-active curing agent, the thermosetting resin and the solder powder contained in the bonding sheet 65.

Further, it is preferred that the bonding sheet 65 further contains a film-forming resin as the constituent materials thereof in addition to the flux-active curing agent, the thermosetting resin and the solder powder. Use of the film-forming resin makes it possible to reliably form the bonding sheet 65 into a film shape.

The same resin as described in connection with the above process [1B-2] can be used as the film-forming resin.

Further, the film-forming resin may be a commercially available one. Additives such as various kinds of plasticizers, a stabilizing agent, an inorganic filler, an antistatic agent and a pigment may be mixed with the bonding sheet 65 to an extent that does not mar effects provided by the present invention.

An amount of the film-forming resin contained in the bonding sheet 65 is preferably in the range of about 5 to 50 wt %, based on a total amount of the constituent materials of the bonding sheet 65 excluding the solder powder. By setting the amount of the film-forming resin to fall within such a range, it is possible to suppress an increase in an elastic modulus of the insulating portion 226 while inhibiting a decrease in a film formation property of the bonding sheet 65. This makes it possible to further improve the adhesion between the bonding layer 60' and the first and second semiconductor wafers 210 and 220, and to suppress an increase in a melt viscosity of the bonding sheet 65.

Such a bonding sheet 65 can be produced by, e.g., dissolving the flux-active curing agent, the thermosetting resin, the solder powder, if desired, the film-forming resin, and other components into a solvent to prepare a bonding sheet formation material (or a liquid material), applying the bonding sheet formation material on a release-treated base member such as a polyester sheet or the like, removing the solvent from the bonding sheet formation material at a predetermined temperature, and then drying the same.

In this regard, it is to be noted that the solvent used at this time may be the same one as described in connection with the above process [1A-2].

Further, a thickness (an average thickness) of the bonding sheet 65 is not particularly limited to a specific value, but may be preferably in the range of about 5 to 300 μm, and more preferably in the range of about 10 to 200 μm.

[1D-3] Next, the first and second semiconductor wafers 210 and 220 are positioned together so that the ends of the connector portions 212 located on the side of the functional surface 211 correspond to the ends of the connector portions 222 located on the side of the rear surface 223. As shown in FIG. 6C, the first and second semiconductor wafers 210 and 220 are brought into contact with each other through the bonding layer 60 (or the bonding sheet 65), thereby producing a semiconductor wafer stacked body 230 in which the first and second semiconductor wafers 210 and 220 are stacked together (second process).

[1D-4] Next, in the same manner as in the above process [1C-4], the semiconductor wafer stacked body 230 is compressed in a thickness direction thereof while heating the same. This produces a semiconductor wafer bonded body 240 as shown in FIG. 6D.

As described above, the semiconductor wafer bonded body 240 can be produced using the first to fourth methods for bonding semiconductor wafers.

[2] Next, a plurality of semiconductor chips 20 is obtained by dicing the semiconductor wafer bonded body 240 in a corresponding relationship with the each circuit portions formed on the respective first and second semiconductor wafers 210 and 220.

By dicing the semiconductor wafer bonded body 240 produced using the method for bonding semiconductor wafers of the present invention into a plurality of semiconductor chips (semiconductor chip stacked bodies) 20 at one time, it is possible to reduce the number of manufacturing processes and to improve productivity of a semiconductor device 10 as compared to the above described prior art method in which semiconductor chip stacked bodies are mass-produced by individually stacking and bonding a plurality of semiconductor chips together.

[3] Next, an interposer (or a substrate) 30 having a wiring pattern 40 provided on an upper surface thereof and bumps 70 provided on a lower surface thereof is prepared, and the semiconductor chips (semiconductor elements) 20 are mounted on the interposer 30 through the wiring pattern 40.

A semiconductor device 10 can be manufactured by way of the processes described above.

According to the semiconductor device 10 manufactured in this manner, it is possible to increase an integration density of the semiconductor chips 20 provided in a single package. This makes it possible to meet a demand for high functionality and size reduction of electronic devices.

In this regard, it is to be noted that the semiconductor device 10 manufactured by the method for manufacturing a semiconductor device of the present invention can be extensively used in, e.g., cellular phones, digital cameras, video cameras, car navigations, personal computers, game machines, liquid crystal TV sets, liquid crystal displays, organic EL displays, printers, and the like.

While the method for bonding semiconductor wafers and the method for manufacturing a semiconductor device of the present invention have been described hereinabove, the present invention shall not be limited thereto.

For example, although the above description is directed to a case in which a single first semiconductor wafer 210 and a single second semiconductor wafer 220 are bonded together, the method for bonding semiconductor wafers of the present invention is not limited thereto. As an alternative example, two or more second semiconductor wafers 220 may be stacked on a single first semiconductor wafer 210, and then the first and second semiconductor wafers 210 and 220 may be bonded together at one time. As another alternative example, a single first semiconductor wafer 210 and a single second semiconductor wafer 220 may be bonded together to produce a semiconductor wafer bonded body 240, and then an additional second semiconductor wafer 220 may be bonded to the semiconductor wafer bonded body 240 thus produced.

In addition, for example, one or more arbitrary processes may be added to the method for bonding semiconductor wafers and the method for manufacturing a semiconductor device of the present invention.

EXAMPLES

Next, description will be made on certain specific examples of the present invention.

1. Production of Bonding Sheet and Preparation of Bonding Layer Formation Material In this regard, it is to be noted that sample numbers identified below correspond to numbers of Examples (or semiconductor devices) in which bonding sheets or bonding layer formation materials of the respective sample numbers are used. Further, Sample No. 1B' corresponds to Comparative Example 1B.

1-1. Production of Bonding Sheet

[Sample Nos. 1A to 34A]

Bonding sheets of Sample Nos. 1A to 34A were produced by dissolving various components (constituent materials) in mixing ratios shown in Tables 1-A to 1-C into an aromatic hydrocarbon based solvent such as toluene or xylene, an ester based organic solvent such as ethyl acetate or butyl acetate, or a ketone based organic solvent such as acetone or methyl ethyl ketone to prepare a varnish (a bonding sheet formation material), applying the prepared varnish on a polyester sheet, and then drying the varnish at a temperature which is suitably set to volatilize the solvent.

Further, an amount of each component shown in Tables 1-A to 1-C is indicated by a percent by weight based on a total amount of the components.

[Sample Nos. 1B to 21B and Sample No. 1B']

Bonding sheets of Sample Nos. 1B to 21B and Sample No. 1B' were produced by dissolving various components (constituent materials) in mixing ratios shown in Tables 3-A and 3-B into an aromatic hydrocarbon based solvent such as toluene or xylene, an ester based organic solvent such as ethyl acetate or butyl acetate, or a ketone based organic solvent such as acetone or methyl ethyl ketone to prepare a varnish (a bonding sheet formation material), applying the prepared varnish on a polyester sheet, and then drying the varnish at a temperature which is suitably set to volatilize the solvent.

Further, an amount of each component shown in Tables 3-A and 3-B is indicated by a percent by weight based on a total amount of the components.

1-2. Preparation of Bonding Layer Formation Material

[Sample Nos. 35A to 45A]

Bonding layer formation materials (liquid materials) of Sample Nos. 35A to 45A were prepared by kneading various components (constituent materials) in mixing ratios shown in Tables 2-A and 2-B using a three-roll kneader, and then subjecting the same to a vacuum defoaming treatment.

2. Manufacture of Semiconductor Device

Twenty semiconductor devices were manufactured in each of Examples and Comparative Examples described below.

Example 1A

Figure 7:
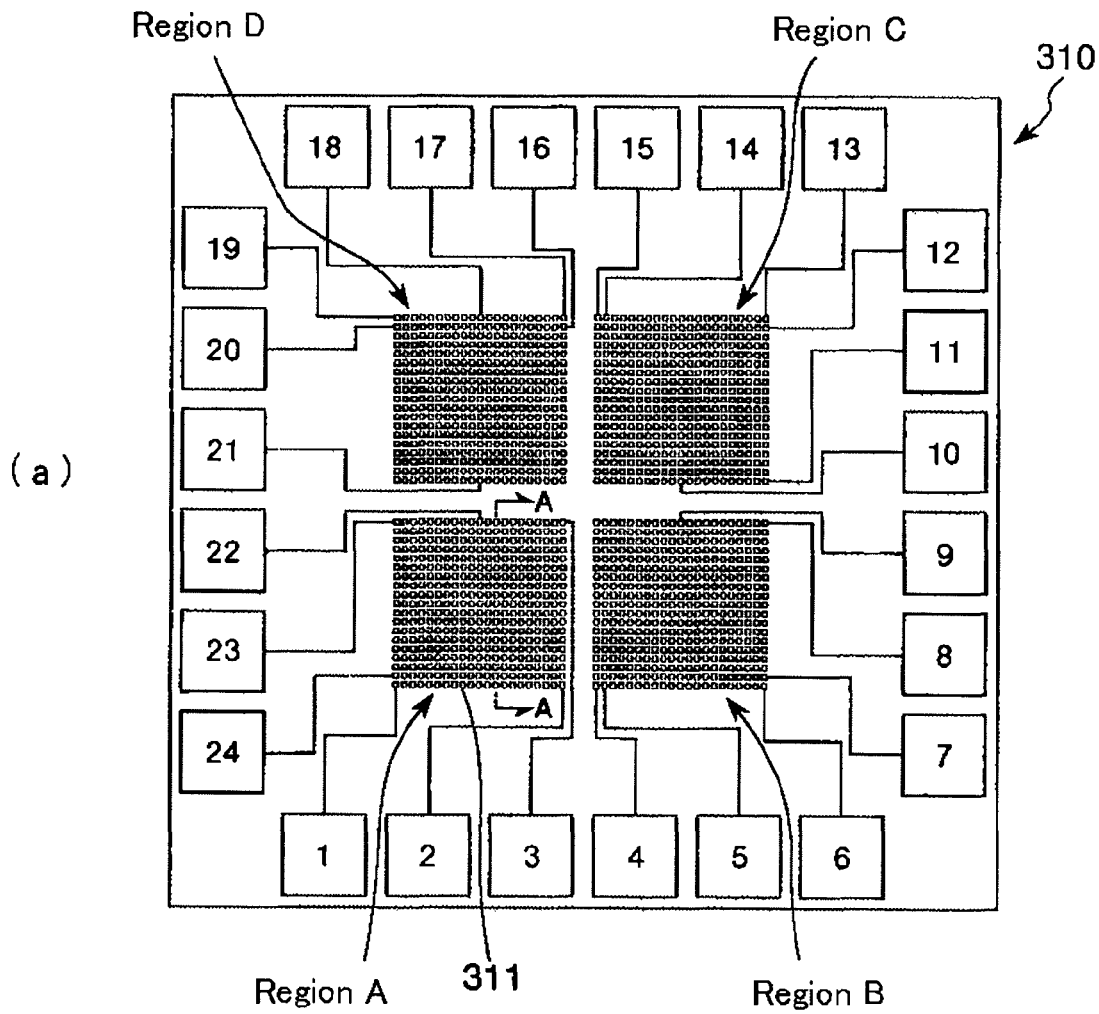
FIG. 7A is a plan view showing a configuration of one of circuits formed on a test wafer and FIG. 7B is a section view taken along line A-A in FIG. 7A.
Figure 7:
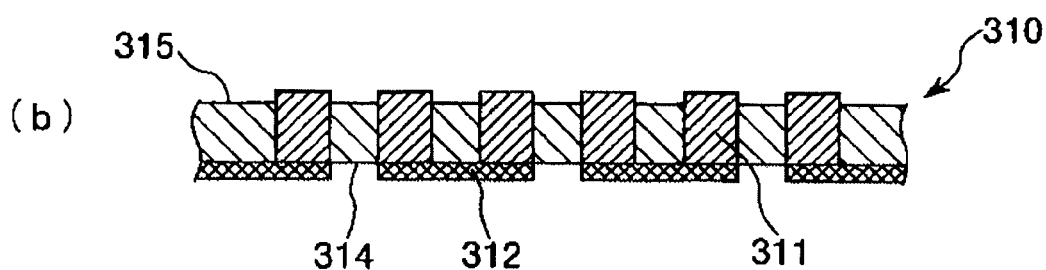

-1A- First, as shown in FIGS. 7A and 7B, two silicon wafers (namely, two 8-inch test wafers each having a thickness of 60 μm) were prepared. On each of the silicon wafers, fifty circuits 310 each having a size of 20 mm×20 mm and a plurality of penetrating metal (copper) electrodes Through silicon via 311 were formed.

In this regard, it is to be noted that FIG. 7A is a plan view showing one of the circuits 310 formed on the silicon wafer. FIG. 7B is a section view taken along line A-A in FIG. 7A.

As can be seen in FIG. 7A, 28×28 penetrating metal electrodes 311 were provided in each of the regions A to D of the circuit 310 so as to extend through the silicon wafer in a thickness direction thereof. For the purpose of evaluating connection conductivity and insulation property, in the region A, first to third terminals and twenty second to twenty fourth terminals were provided so as to be connected to some of the penetrating metal electrodes 311 present in this region A through wiring lines. In the region B, fourth to ninth terminals were provided so as to be connected to some of the penetrating metal electrodes 311 present in this region B through wiring lines. In the region C, tenth to fifteenth terminals were provided so as to be connected to some of the penetrating metal electrodes 311 present in this region C through wiring lines. Further, in the region D, sixteenth to twenty first terminals were provided so as to be connected to some of the penetrating metal electrodes 311 present in this region D through wiring lines.

In this regard, it is to be noted that an interval (a pitch) between the adjacent penetrating metal electrodes 311 was set equal to 150 μm.

Further, as shown in FIG. 7B, electrical conductors 312 for connecting some of the adjacent penetrating metal electrodes 311 were provided on a rear surface 314 of the silicon wafer.

-2A- Next, using a flip chip bonder, lead-free solders (having a composition of Sn/3.5Ag, a melting point of 221° C. and a thermal expansion coefficient of 22 ppm/° C.) were placed on a functional surface 315 of each of the silicon wafers in such positions as to make contact with the penetrating metal electrodes 311. The lead-free solders were temporarily bonded to each of the silicon wafers and then subjected to a reflow treatment (by passing the same through an IR reflow machine for 60 seconds at a maximum temperature of 260° C. and a minimum temperature of 183° C.) By doing so, the lead-free solders were bonded to the penetrating metal electrodes 311 to form solder bumps. A diameter of each solder bump was 40 μm.

-3A- Next, the bonding sheet of Sample No. 1A was attached to the functional surface 315 of each of the silicon wafers with the solder bumps using a vacuum film laminator ("MVLP-500/600-2A" produced by Meiki Co., Ltd.).

In this regard, it is to be noted that the attachment of the bonding sheet to each of the silicon wafers using the vacuum film laminator was performed under the treatment conditions of 100° C., 0.8 MPa and 30 seconds.

Further, a thickness of the bonding sheet of Sample No. 1A attached to each of the silicon wafers was 40 μm.

-4A- Next, two silicon wafers with the bonding sheets obtained in the above process -3A- were positioned together, and then temporarily laminated themselves with alignment using a press machine ("VH1-1758"), thereby producing a silicon wafer stacked body.

In this regard, it is to be noted that the temporarily lamination of the silicon wafers with the bonding sheets was performed under the treatment conditions of 150° C. and 1.0 MPa.

Figure 8:
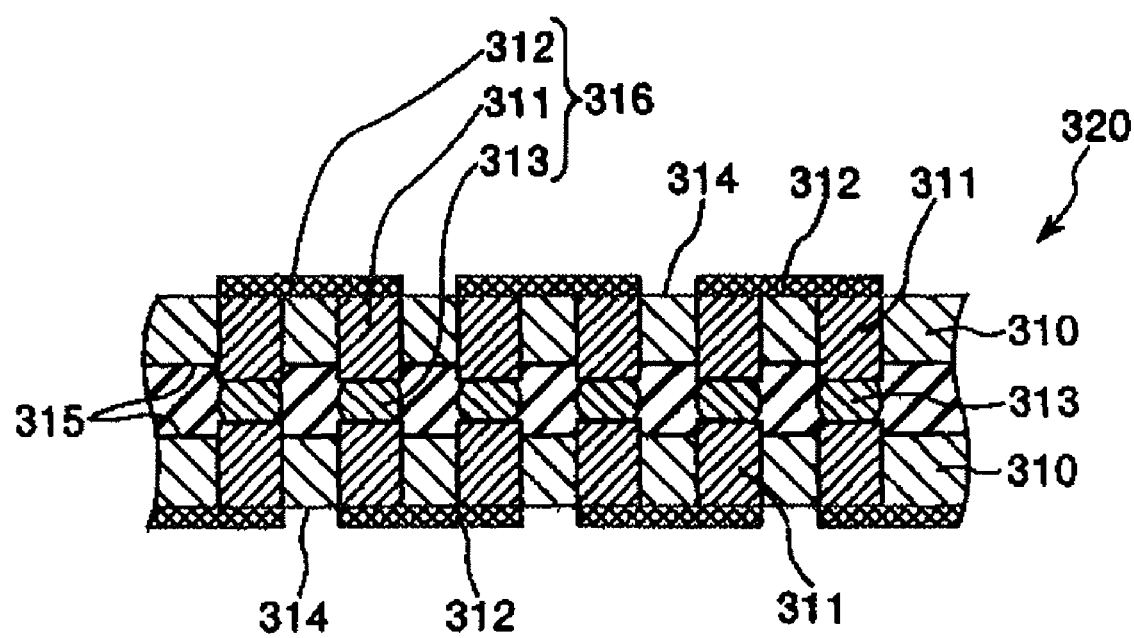
FIG. 8 is a section view showing a configuration of a circuit bonded wafer in which the circuits are bonded together.

-5A- Next, the silicon wafer laminated body obtained in the above process -4A- was heated to a temperature of 250° C. while keeping the state of the above process -4A- unchanged and gradually releasing the pressure (to become 0.1 MPa or less), thereby forming metal bonds between the penetrating metal electrodes 311 present in the respective regions A to D of the circuit 310 and solidified products 313 of molten solder bumps as shown in FIG. 8. Thereafter, the silicon wafer laminated body was reheated at 180° C. for 60 minutes, thereby producing a silicon wafer bonded body including a circuit bonded body 320 in which two circuits 310 are electrically connected together through the solidified products 313.

As described above, in each of the silicon wafers, one of the penetrating metal electrodes 311 is connected to another adjacent penetrating metal electrode 311 through the electrical conductor 312. Therefore, by connecting the penetrating metal electrodes 311 provided in one silicon wafer and the corresponding penetrating metal electrodes 311 provided in the other silicon wafer through the solidified products 313, as shown in FIG. 8, a plurality of wiring lines 316 each comprised from the penetrating metal electrodes 311, the electrical conductors 312 and the solidified products 313 could be formed in the circuit bonded body 320.

Figure 9:
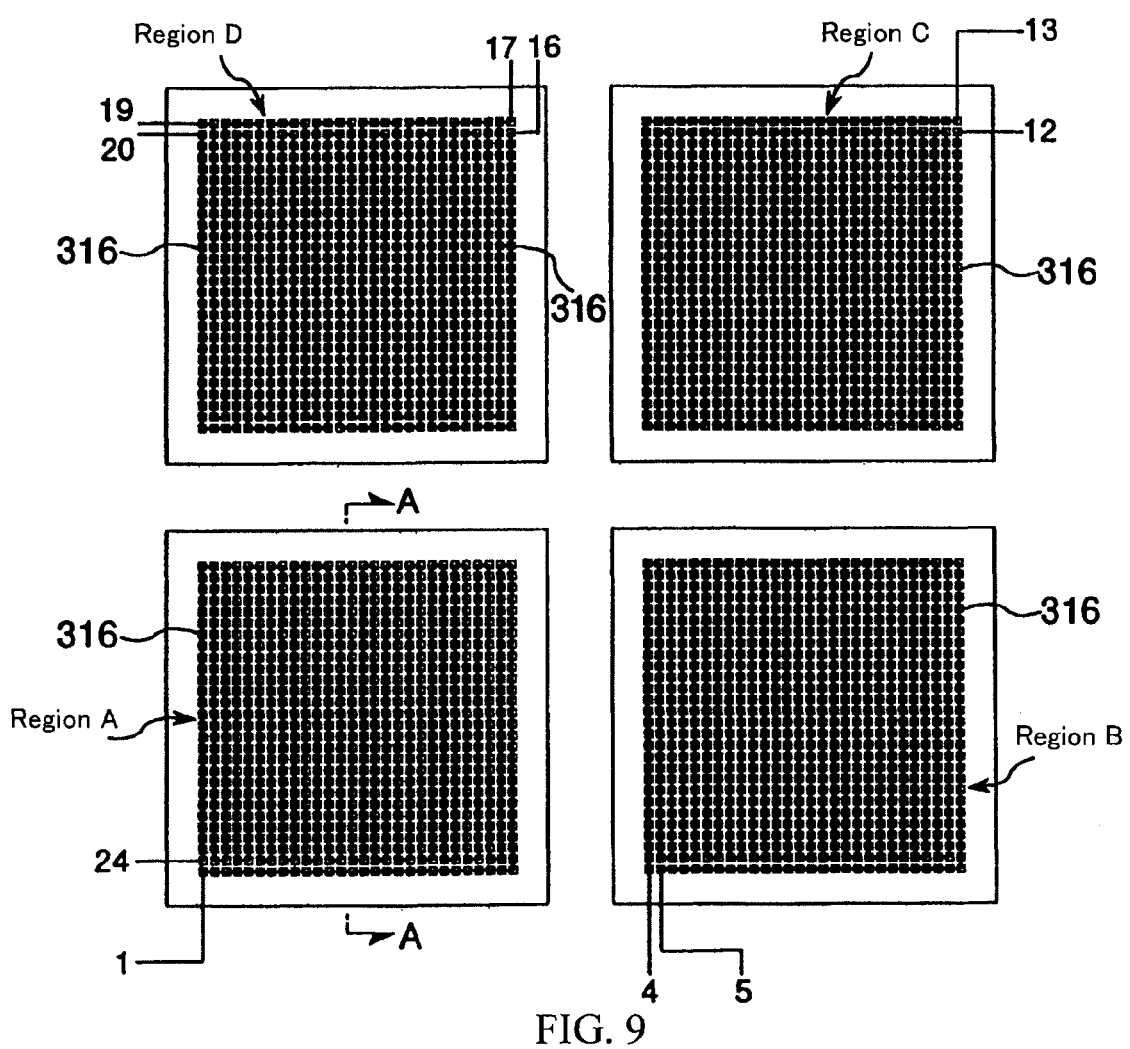
FIG. 9 is a plan view showing the configuration of the circuit bonded body.

In this Example, as shown in FIG. 9, the circuits 310 were formed on each of the silicon wafers so that the first terminal of one of the circuits 310 and the twenty fourth terminal of the other circuit 310 could be electrically connected together through the wiring line 316 including the 28×28 penetrating metal electrodes 311 in the region A of the circuit bonded body 320. Further, the circuits 310 were formed on each of the silicon wafers so that the fourth terminal of the one circuit 310 and the fifth terminal of the other circuit 310 could be electrically connected together through the wiring line 316 including the 28×28 penetrating metal electrodes 311 in the region B of the circuit bonded body 320. Furthermore, the circuits 310 were formed on each of the silicon wafers so that the twelfth terminal of the one circuit 310 and the thirteenth terminal of the other circuit 310 could be electrically connected together through the wiring line 316 including the 28×28 penetrating metal electrodes 311 in the region C of the circuit bonded body 320. In addition, the circuits 310 were formed on each of the silicon wafers so that the seventeenth terminal of the circuit 310 and the nineteenth terminal of the other circuit 310 could be electrically connected together through the wiring line 316 including the 28×14 penetrating metal electrodes 311, while the eighteenth terminal of the one circuit 310 and the twentieth terminal of the other circuit 310 could be electrically connected together through the wiring line 316 including the 28×14 penetrating metal electrodes 311 in the region D of the circuit bonded body 320.

Figure 10:
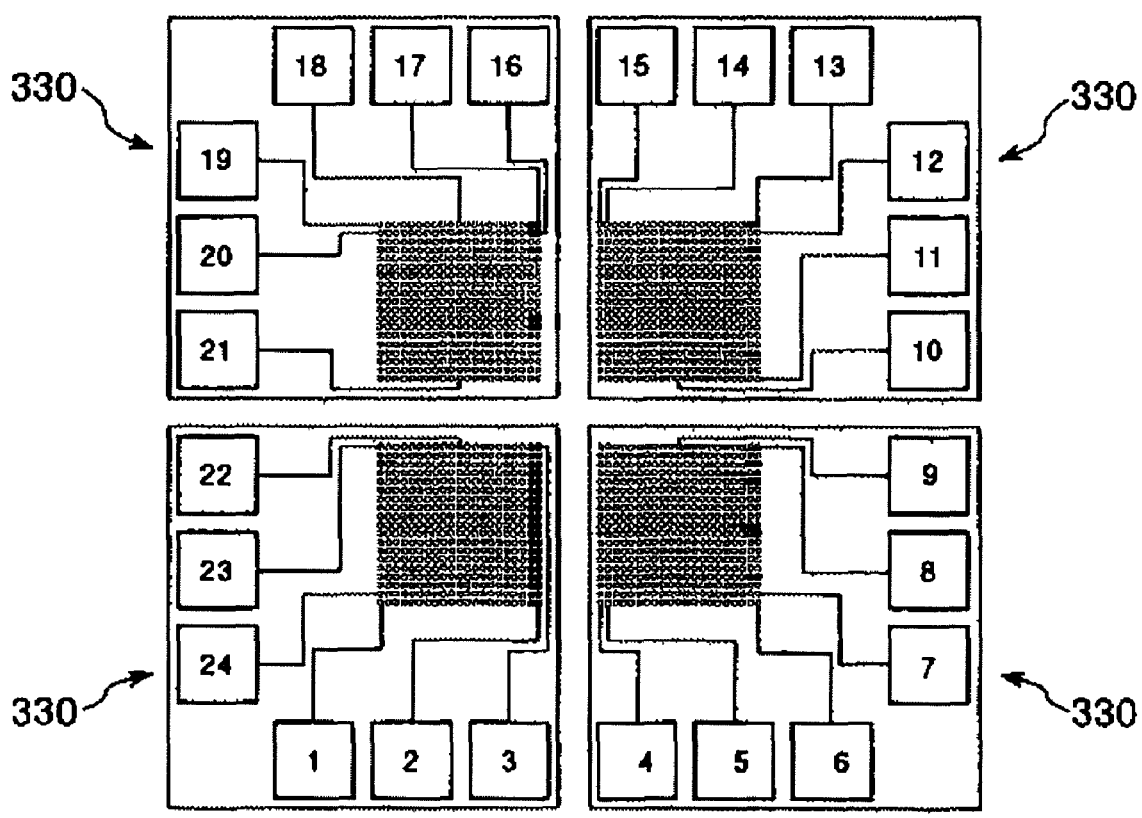
FIG. 10 is a plan view showing the circuit bonded body in a diced state.
Figure 11:
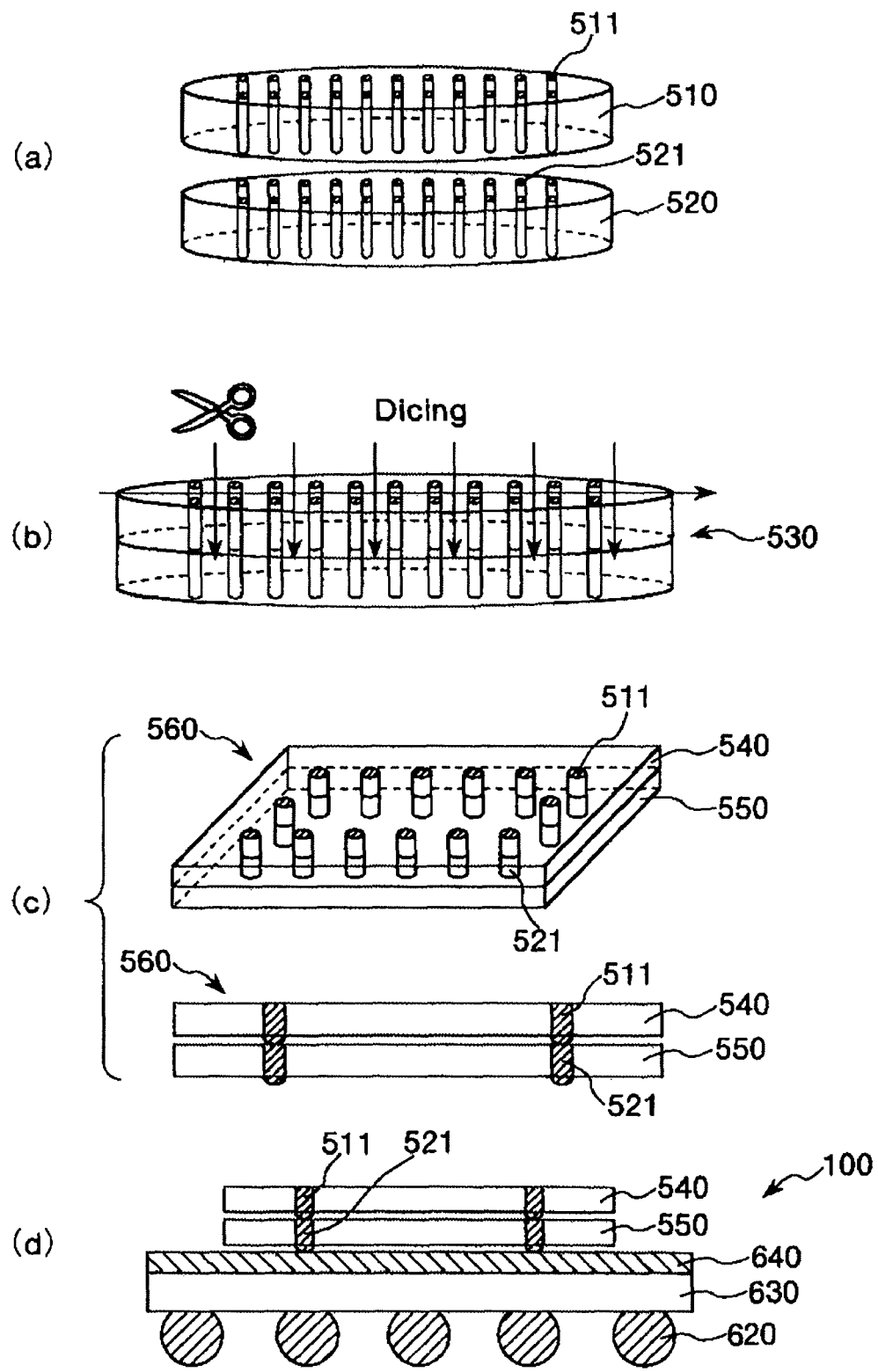
FIGS. 11A to 11D are views for explaining a conventional bonding method for bonding semiconductor wafers.

-6A- Next, as shown in FIG. 10, the circuit bonded body 320 included in the silicon wafer bonded body was diced so as to be divided into the respective regions (each circuit portions) A to D, thereby producing a plurality of diced test chips 330 for conduction evaluation each having a size of 10 mm×10 mm square.

-7A- Next, using a flip chip bonder, lead-free solders (having a composition of Sn/3.5Ag, a melting point of 221° C. and a thermal expansion coefficient of 22 ppm/° C.) were placed on portions corresponding to the terminals of the test chip 330 and temporarily bonded thereto. Thereafter, the lead-free solders were subjected to a reflow treatment (by passing the same through an IR reflow machine for 60 seconds at a maximum temperature of 260° C. and a minimum temperature of 183° C.) in a state that the test chip 330 was mounted on a printed circuit board. By doing so, the terminals of the test chip 330 was boded to the printed circuit board through the lead-free solders, thereby manufacturing a test package (or a semiconductor device) of Example 1A.

In this regard, it is to be noted that when the terminals of the test chip 330 were bonded to the printed circuit board, the mutually opposed terminals included in the test chip 330 were also electrically connected together.

Further, in this Example, twenty semiconductor devices provided with the test chips 330 were manufactured in this process -7A- using four groups of five test chips 330, each group of which originates from the respective regions A to D.

Examples 2A to 34A

In each of Examples 2A to 34A, twenty semiconductor devices were manufactured in the same manner as in Example 1A, except that each of the bonding sheets of Sample Nos. 2A to 34A was used in place of the bonding sheet of Sample No. 1A in the above process -3A-.

Example 35A

In Example 35A, twenty semiconductor devices were manufactured in the same manner as in Example 1A, except that the above process -3A- was changed to the following process -3B-.

-3B- Next, the bonding layer formation material of Sample No. 35 was applied on the functional surface 315 of the silicon wafer with the solder bumps using a spin coat method, thereby forming a bonding layer on the functional surface 315. In this regard, it is to be noted that an average thickness of the bonding layer was 40 μm.

Examples 36A to 40A

In each of Examples 36A to 40A, twenty semiconductor devices were manufactured in the same manner as in Example 35A, except that each of the bonding layer formation materials of Sample Nos. 36A to 40A was used in place of the bonding layer formation material of Sample No. 35A in the above process -3B-.

Examples 41A to 45A

In each of Examples 41A to 45A, twenty semiconductor devices were manufactured in the same manner as in Example 35A, except that each of the bonding layer formation materials of Sample Nos. 41A to 45A was used in place of the bonding layer formation material of Sample No. 35A in the above process -3B-, and that the bonding layer was subjected to a heat treatment at 90° C. for 90 minutes after the above process -3B- so that it was allowed to reach a B-stage cure (or a temporarily cure) to thereby keep a shape of the bonding layer.

Comparative Examples 1A and 2A

In each of Comparative Examples 1A and 2A, twenty semiconductor devices were manufactured in the same manner as in Example 1A, except that in the case of Comparative Example 1A, an anisotropic conductive film ("AC-200" produced by Hitachi Chemical Co., Ltd.) was used in place of the bonding sheet of Sample No. 1A in the above process -3A-, while in the case of Comparative Example 2A, an anisotropic conductive film ("FP2511K" produced by Sony Chemicals Corp.) was used in place of the bonding sheet of Sample No. 1A in the above process -3A-, and that the above process -5A- was omitted.

Example 1B

-1C- First, two silicon wafers (namely, two 8-inch test wafers each having a thickness of 60 μm) described in the above process -1A- were prepared.

-2C- Next, the bonding sheet of Sample No. 1B was attached to the functional surface 315 of each of the silicon wafers using a vacuum film laminator ("MVLP-500/600-2A" produced by Meiki Co., Ltd.).

In this regard, it is to be noted that the attachment of the bonding sheet to each of the silicon wafers using the vacuum film laminator was performed under the treatment conditions of 100° C., 0.8 MPa and 30 seconds.

Further, a thickness of the bonding sheet of Sample No. 1B attached to each of the silicon wafers was 40 μm.

-3C- Next, two silicon wafers with the bonding sheets obtained in the above process -2C- were positioned together, and then laminated together using a compression machine ("280ASB-M001" produced by Tsukuba Mechanics Co., Ltd.), thereby producing a silicon wafer laminated body.

In this regard, it is to be noted that the lamination of the silicon wafers with the bonding sheets was performed under the treatment conditions of 160° C. and 2.0 MPa.

-4C- Next, the silicon wafer laminated body obtained in the above process -3C- was kept in the state of the above process -3C- for 10 minutes, thereby producing a silicon wafer bonded body provided with a circuit bonded body 320 in which two circuits 310 were electrically connected together through solidified products 313 of molten particles of solder powder as shown in FIG. 8.

In the silicon wafer bonded body thus produced, the circuits 310 were electrically connected together in the same manner as described in Example 1A. Specifically, as shown in FIG. 9, the circuits 310 were formed on each of the silicon wafers so that the first terminal of one of the circuits 310 and the twenty fourth terminal of the other circuit 310 could be electrically connected together through the wiring line 316 including the 28×28 penetrating metal electrodes 311 in the region A of the circuit bonded body 320. Further, the circuits 310 were formed on each of the silicon wafers so that the fourth terminal of the one circuit 310 and the fifth terminal of the other circuit 310 could be electrically connected together through the wiring line 316 including the 28×28 penetrating metal electrodes 311 in the region B of the circuit bonded body 320. Furthermore, the circuits 310 were formed on each of the silicon wafers so that the twelfth terminal of the one circuit 310 and the thirteenth terminal of the other circuit 310 could be electrically connected together through the wiring line 316 including the 28×28 penetrating metal electrodes 311 in the region C of the circuit bonded body 320. In addition, the circuits 310 were formed on each of the silicon wafers so that the seventeenth terminal of the circuit 310 and the nineteenth terminal of the other circuit 310 could be electrically connected together through the wiring line 316 including the 28×14 penetrating metal electrodes 311, while the eighteenth terminal of the one circuit 310 and the twentieth terminal of the other circuit 310 could be electrically connected together through the wiring line 316 including the 28×14 penetrating metal electrodes 311 in the region D of the circuit bonded body 320.

-5C- Next, as shown in FIG. 10, the circuit bonded body 320 included in the silicon wafer bonded body was diced so as to be divided into the respective regions (each circuit portions) A to D, thereby producing a plurality of diced test chips 330 for conduction evaluation each having a size of 10 mm×10 mm square.

-6C- Next, using a flip chip bonder, lead-free solders (having a composition of Sn/3.5Ag, a melting point of 221° C. and a thermal expansion coefficient of 22 ppm/° C.) were placed on portions corresponding to the terminals of the test chip 330 and temporarily bonded thereto. Thereafter, the lead-free solders were subjected to a reflow treatment (by passing the same through an IR reflow machine for 60 seconds at a maximum temperature of 260° C. and a minimum temperature of 183° C.) in a state that the test chip 330 was mounted on a printed circuit board. By doing so, the terminals of the test chip 330 was bonded to the printed circuit board through the lead-free solders, thus manufacturing a test package (or a semiconductor device) of Example 1B.

In this regard, it is to be noted that when the terminals of the test chip 330 were bonded to the printed circuit board, the mutually opposed terminals included in the test chip 330 were also electrically connected together.

Further, in this Example, twenty semiconductor devices provided with the test chips 330 were manufactured in this process -6C- using four groups of five test chips 330, each group of which originates from the respective regions A to D.

Examples 2B to 21B

In each of Examples 2B to 21B, twenty semiconductor devices were manufactured in the same manner as in Example 1B, except that each of the bonding sheets of Sample Nos. 2B to 21B was used in place of the bonding sheet of Sample No. 1B in the above process -2C-.

Comparative Example 1B

In Comparative Example 1B, twenty semiconductor devices were manufactured in the same manner as in Example 1B, except that the bonding sheet of Sample No. 1B' was used in place of the bonding sheet of Sample No. 1B in the above process -2C-.

Comparative Examples 2B and 3B

In each of Comparative Examples 2B and 3B, twenty semiconductor devices were manufactured in the same manner as in Example 1B, except that in the case of Comparative Example 2B, an anisotropic conductive film ("AC-200" produced by Hitachi Chemical Co., Ltd.) was used in place of the bonding sheet of Sample No. 1B in the above process -2C-, while in the case of Comparative Example 3B, an anisotropic conductive film ("FP2511K") produced by Sony Chemicals Corp.) was used in place of the bonding sheet of Sample No. 1B in the above process -2C-.

2. Evaluation

Thermal cycle tests were conducted one hundred cycle times. In each cycle time, every twenty semiconductor devices obtained in the respective Examples and the respective Comparative Examples were maintained at −55° C. for 30 minutes and at 125° C. for 30 minutes in an alternating manner.

Thereafter, with respect to the semiconductor devices of the respective Examples and the respective Comparative Examples which have undergone the thermal cycle tests, conduction of the test chips 330 was checked by applying a voltage of 5V between the terminals of the test chips 330 using a conduction tester.

In this regard, the conduction between the first and twenty fourth terminals was checked in respect of the semiconductor devices provided with the test chips 330 originating from the region A of the circuit bonded body 320. The conduction between the fourth and fifth terminals was checked in respect of the semiconductor devices provided with the test chips 330 originating from the region B of the circuit bonded body 320. The conduction between the twelfth and thirteenth terminals was checked in respect of the semiconductor devices provided with the test chips 330 originating from the region C of the circuit bonded body 320. The conduction between the seventeenth and nineteenth terminals and the conduction between the sixteenth and twentieth terminals were checked in respect of the semiconductor devices provided with the test chips 330 originating from the region D of the circuit bonded body 320.

In each of Examples and each of Comparative Examples, the semiconductor devices were determined to be in good quality (A) if all of the twenty semiconductor devices were conducted. The semiconductor devices were determined to be in poor quality (B) if only one of the twenty semiconductor devices was not conducted.

In this regard, it is to be noted that the term "conducted" used herein means that a resistance value between the terminals is smaller than 80Ω, while the term "not conducted" means that the resistance value between the terminals is equal to or greater than 80 Ω.

In addition, with respect to the semiconductor devices provided with the test chips 330 originating from the region D of the circuit bonded body 320, insulation between the adjacent wiring lines was checked using the conduction tester. That is to say, insulation between the wiring line 316 connecting the seventeenth and nineteenth terminals together and the wiring line 316 connecting the sixteenth and twentieth terminals together was checked More specifically, insulation between the sixteenth and seventeenth terminals was checked by applying a voltage of 5V therebetween. Further, insulation between the nineteenth and twentieth terminals was checked in the same manner.

In each of Examples and each of Comparative Examples, the semiconductor devices were determined to be in good quality (A) if all of the five semiconductor devices were insulated. The semiconductor devices were determined to be in poor quality (B) if only one of the five semiconductor devices was not insulated.

In this regard, it is to be noted that the term "insulated" used herein means that a resistance value between the terminals is equal to or greater than $1.0 \times 10^9 \Omega$, while the term "not insulated" used herein means that the resistance value between the terminals is smaller than $1.0 \times 10^9 \Omega$.

Results of these evaluations are shown in the following Tables 1-A to 1-C, 2-A, 2-B, 3-A, 3-B and 4.

TABLE 1-A

| | Component | Chemical structure etc | Ex. 1A | Ex. 2A | Ex. 3A | Ex. 4A | Ex. 5A | Ex. 6A | Ex. 7A | Ex. 8A | Ex. 9A | Ex. 10A | Ex. 11A |
|---|---|---|---|---|---|---|---|---|---|---|---|---|---|
| Film-forming resin | High heat-resistant phenoxy resin | "YL-6954"[1] | 20 | 20 | 20 | 20 | 20 | 20 | 20 | 20 | 20 | 20 | 20 |
| Thermo-Setting resin / Curable component | Epoxy resin | "Epiclon840S"[2] | 40 | 50 | 50 | 50 | 50 | 50 | 50 | 50 | 50 | 50 | 50 |
| / Curing agent | Phenol novolak | "PR-53647"[3] | 20 | 20 | 25 | 25 | 25 | 25 | 25 | 25 | 25 | 25 | 25 |
| Flux-active curing agent | Catechol | | | | | 5 | | | | | | | |
| | o,o-bisphenol F | | | | | | 5 | | | | | | |
| | Hexahydrophthalic acid anhydride | | | | | | | 5 | | | | | |
| | Benzophenone tetracarboxylic acid anhydrate | | | | | | | | 5 | | | | |
| | Lauric acid | | | | | | | | | 5 | | | |
| | Phthalic acid | | | | | | | | | | 5 | | |
| | Sebacic acid | [4] | | | | | | | | | | 5 | |
| | Adipic acid | | | | | | | | | | | | 5 |
| | Phenol phthalin | [5] | 20 | 10 | 5 | | | | | | | | |
| Conduction test result (the number of samples (semiconductor devices) with no-problem were counted) | | | 20/20 | 20/20 | 20/20 | 20/20 | 20/20 | 20/20 | 20/20 | 20/20 | 20/20 | 20/20 | 20/20 |
| Conduction test determination | | | A | A | A | A | A | A | A | A | A | A | A |
| Insulation test result (the number of samples (semiconductor devices) with insulation were counted) | | | 5/5 | 5/5 | 5/5 | 5/5 | 5/5 | 5/5 | 5/5 | 5/5 | 5/5 | 5/5 | 5/5 |
| Insulation test determination | | | A | A | A | A | A | A | A | A | A | A | A |

[1]"YL-6954" is produced by Japan Epoxy resins Co., Ltd.
[2]"Epiclon840S" is a liquid bis A type epoxy resin having an epoxy equivalent of 180 and produced by Dainippon ink and chemicals, Incorporated.
[3]"PR-53647" is a resin having a softening point of 95° C. and an OH equivalent of 104 and produced by Sumitomo Bakelite Co., Ltd.
[4] and [5]"Sebacic acid" and "Phenol phthalin" are produced by Tokyo Chemical Industry Co., Ltd.

TABLE 1-B

| | Component | Chemical structure etc | Ex. 12A | Ex. 13A | Ex. 14A | Ex. 15A | Ex. 16A | Ex. 17A | Ex. 18A | Ex. 19A | Ex. 20A | Ex. 21A | Ex. 22A |
|---|---|---|---|---|---|---|---|---|---|---|---|---|---|
| Film-forming resin | High heat-resistant phenoxy resin | "YL-6954"[1] | 20 | 20 | 20 | 5 | 40 | 20 | 20 | 20 | | | |
| | Silicone-modified polyimide | SIM(1) | | | | | | | | | 20 | 20 | 20 |

TABLE 1-B-continued

| | Component | Chemical structure etc | Ex. 12A | Ex. 13A | Ex. 14A | Ex. 15A | Ex. 16A | Ex. 17A | Ex. 18A | Ex. 19A | Ex. 20A | Ex. 21A | Ex. 22A |
|---|---|---|---|---|---|---|---|---|---|---|---|---|---|
| Thermo-Setting resin | Curable component | Epoxy resin | "Epiclon840S"*2 | 50 | 50 | 50 | 60 | 40 | | 70 | 70 | 40 | 50 | 50 |
| | | Epoxy resin | "NC6000"*3 | | | | | | 50 | | | | | |
| | Curing agent | Phenol novolak | "PR-53647"*4 | 25 | 25 | 25 | 30 | 20 | 25 | | | 20 | 20 | 25 |
| | | imidazole | "2PHZ-PW"*5 | | | | | | | 5 | | | | |
| | | imidazole | "2P4MHZ"*6 | | | | | | | | 5 | | | |
| Flux-active curing agent | | Salicylic acid | | 5 | | | | | | | | | | |
| | | Gentistic acid | *7 | | 5 | | | | | | | | | |
| | | 1,4-dihydroxy-2-naphthoic acid | | | | 5 | | | | | | | | |
| | | Phenol phthalin | *8 | | | | 5 | 5 | 5 | 5 | 5 | 20 | 10 | 5 |
| Conduction test result (the number of samples (semiconductor devices) with no-problem were counted) | | | | 20/20 | 20/20 | 20/20 | 20/20 | 20/20 | 20/20 | 20/20 | 20/20 | 20/20 | 20/20 | 20/20 |
| Conduction test determination | | | | A | A | A | A | A | A | A | A | A | A | A |
| Insulation test result (the number of samples (semiconductor devices) with insulation were counted) | | | | 5/5 | 5/5 | 5/5 | 5/5 | 5/5 | 5/5 | 5/5 | 5/5 | 5/5 | 5/5 | 5/5 |
| Insulation test determination | | | | A | A | A | A | A | A | A | A | A | A | A |

*1"YL-6954" is produced by Japan Epoxy resins Co., Ltd.
*2"Epiclon840S" is a liquid bis A type epoxy resin having an epoxy equivalent of 180 and produced by Dainippon ink and chemicals, Incorporated.
*3"NC6000" is a solid three functional epoxy resin having a softening point of 60° C. and produced by Nippon Kayaku Co., Ltd.
*4"PR-53647" is a resin having a softening point of 95° C. and an OH equivalent of 104 and produced by Sumitomo Bakelite Co., Ltd.
*5"2PHZ-PW" is 2-phenyl-4,5-dihydroxymethyl imidazole and produced by Shikoku Chemicals Corporation.
*6"2P4MHZ" is 2-phenyl-4-methyl-5-hydroxyimidazole and produced by Shikoku Chemicals Corporation.
*7"Gentistic acid" is produced by Midori Kagaku Co., Ltd.
*8"Phenol phthalin" is produced by Tokyo Chemical Industry Co., Ltd.

TABLE 1-C

| | Component | Chemical structure etc | Ex. 23A | Ex. 24A | Ex. 25A | Ex. 26A | Ex. 27A | Ex. 28A | Ex. 29A | Ex. 30A | Ex. 31A | Ex. 32A | Ex. 33A | Ex. 34A |
|---|---|---|---|---|---|---|---|---|---|---|---|---|---|---|---|
| Film-forming resin | | Silicone-modified polyimide | SIM(1) | | 5 | 40 | 20 | 20 | | | | | | | |
| | | | SIM(2) | 20 | | | | | | | | | | | |
| | | Acrylic rubber | *1 | | | | | | 25 | 25 | 25 | 15 | 45 | 25 | 25 |
| Thermo-Setting resin | Curable component | Epoxy resin | "Epiclon840S"*2 | 50 | 60 | 40 | 50 | 50 | | | | | | | |
| | | Epoxy resin | "NC6000"*3 | | | | | | 25 | 25 | 25 | 30 | 15 | 25 | 25 |
| | | Epoxy resin | "EOCN-1020-80"*4 | | | | | | 15 | 10 | 5 | 20 | 5 | 15 | 15 |
| | | Epoxy resin | "RE-304S"*5 | | | | | | 9.5 | 9.5 | 9.5 | 9.5 | 9.5 | 9.5 | 9.5 |
| | Curing agent | Phenol novolak | "PR-53647"*6 | 25 | 30 | 20 | 25 | 25 | | | | | | | |
| | | Phenol novolak | "PR-HF-3"*7 | | | | | | 20 | 20 | 20 | 20 | 20 | 20 | 20 |
| Flux-active curing agent | | Sebacic acid | *8 | | | | | 5 | 5 | 10 | 15 | 5 | 5 | | |
| | | Gentistic acid | *9 | | | | 5 | | | | | | | 5 | |
| | | Phenol phthalin | *10 | 5 | 5 | 5 | | | | | | | | | 5 |
| Additive | Adhesion impartation agent | Silane coupling agent | "KBM-403E"*11 | | | | | | 0.1 | 0.1 | 0.1 | 0.1 | 0.1 | 0.1 | 0.1 |
| | | Silane coupling agent | "KBM-573"*12 | | | | | | 0.4 | 0.4 | 0.4 | 0.4 | 0.4 | 0.4 | 0.4 |
| Conduction test result (the number of samples (semiconductor devices) with no-problem were counted) | | | | 20/20 | 20/20 | 20/20 | 20/20 | 20/20 | 20/20 | 20/20 | 20/20 | 20/20 | 20/20 | 20/20 | 20/20 |
| Conduction test determination | | | | A | A | A | A | A | A | A | A | A | A | A | A |
| Insulation test result (the number of samples (semiconductor devices) with insulation were counted) | | | | 5/5 | 5/5 | 5/5 | 5/5 | 5/5 | 5/5 | 5/5 | 5/5 | 5/5 | 5/5 | 5/5 | 5/5 |
| Insulation test determination | | | | A | A | A | A | A | A | A | A | A | A | A | A |

*1"Acrylic rubber" is a 30 mol % butyl acrylate - 30 mol % ethyl acrylate - 40 mol % acrylonitrile copolymer having a molecular weight of 850,000.
*2"Epiclon840S" is a liquid bis A type epoxy resin having an epoxy equivalent of 180 and produced by Dainippon ink and chemicals, Incorporated.
*3"NC6000" is a solid three functional epoxy resin having a softening point of 60° C. and produced by Nippon Kayaku Co., Ltd.
*4"EOCN-1020-80" is a cresol novolak type epoxy resin having a softening point of 80° C. and produced by Nippon Kayaku Co., Ltd.
*5"RE-304S" is a liquid bis F type epoxy resin having an epoxy equivalent of 170 and produced by Nippon Kayaku Co., Ltd.
*6"PR-53647" is a resin having a softening point of 95° C. and an OH equivalent of 104 and produced by Sumitomo Bakelite Co., Ltd.
*7"PR-HF-3" is a resin having a softening point of 80° C. and an OH equivalent of 105 and produced by Sumitomo Bakelite Co., Ltd
*8 and *10"Sebacic acid" and "Phenol phthalin" are produced by Tokyo Chemical Industry Co., Ltd.
*9"Gentistic acid" is produced by Midori Kagaku Co., Ltd.
*11"KBM-403E" is an epoxy silane and produced by Shin-Etsu Chemical Co., Ltd.
*12"KBM-573" is an aromatic secondary aminosilane and produced by Shin-Etsu Chemical Co., Ltd.

TABLE 2-A

| | | Component | Chemical structure etc | Ex. 35A | Ex. 36A | Ex. 37A | Ex. 38A | Ex. 39A | Ex. 40A |
|---|---|---|---|---|---|---|---|---|---|
| Thermo-Setting resin | Curable component | Epoxy resin | "EXA-830LVP"*1 | 100 | 80 | 80 | 100 | 100 | 80 |
| | | Epoxy resin | "NC3000"*2 | | 20 | | | | 20 |
| | Curing agent | Phenol novolak | "PR-HF-3"*3 | | | 20 | | | |
| | | Imidazole | "2P4Mz"*4 | 0.1 | 0.1 | 0.1 | 0.1 | | 0.1 |
| Flux-active curing agent | | Sebacic acid | *5 | | 30 | | | | |
| | | Gentistic acid | *6 | 30 | | | 30 | 30 | 30 |
| | | Phenol phthalin | *7 | | | 30 | | | |
| Stress lowering agent | | Stress lowering agent | "CTBN1008SP"*8 | 3 | 3 | 1 | 3 | 3 | 2 |
| Additive | Adhesion impartation agent | Silane coupling agent | "KBM-403E"*9 | | | | 1 | | |
| | | Silane coupling agent | "KBM-573"*10 | | | | | 1 | 1 |
| Conduction test result (the number of samples (semiconductor devices) with no-problem were counted) | | | | 20/20 | 20/20 | 20/20 | 20/20 | 20/20 | 20/20 |
| Conduction test determination | | | | A | A | A | A | A | A |
| Insulation test result (the number of samples (semiconductor devices) with insulation were counted) | | | | 5/5 | 5/5 | 5/5 | 5/5 | 5/5 | 5/5 |
| Insulation test determination | | | | A | A | A | A | A | A |

*1 "EXA-830LVP" is a resin having an epoxy equivalent of 165 and produced by Dainippon ink and chemicals, Incorporated.
*2 "NC3000" is a solid epoxy resin having an epoxy equivalent of 272 and produced by Nippon Kayaku Co., Ltd.
*3 "PR-HF-3" is a resin having a softening point of 80° C. and an OH equivalent of 105 and produced by Sumitomo Bakelite Co., Ltd.
*4 "2P4MZ" is produced by Shikoku Chemicals Corporation
*5 and *7 "Sebacic acid" and "Phenol phthalin" are produced by Tokyo Chemical Industry Co., Ltd.
*6 "Gentistic acid" is produced by Midori Kagaku Co., Ltd.
*8 "CTBN1008SP" is produced by Ube Industries, Ltd.
*9 "KBM-403E" is an epoxy silane and produced by Shin-Etsu Chemical Co., Ltd.
*10 "KBM-573" is an aromatic secondary aminosilane and produced by Shin-Etsu Chemical Co., Ltd.

TABLE 2-B

| | | Component | Chemical structure etc | Ex. 41A | Ex. 42A | Ex. 43A | Ex. 44A | Ex. 45A | Com. Ex. 1A | Com. Ex. 2A |
|---|---|---|---|---|---|---|---|---|---|---|
| Thermo-Setting resin | Curable component | Epoxy resin | "EXA-830LVP"*1 | 20 | 50 | | 20 | 20 | — | — |
| | | Epoxy resin | "NC3000"*2 | 80 | 50 | 100 | 80 | 80 | — | — |
| | Curing agent | Imidazole | "2P4MZ"*3 | 0.1 | 0.1 | 0.1 | 0.1 | 0.1 | — | — |
| Flux-active curing agent | | Gentistic acid | *4 | 10 | 20 | 30 | 30 | 10 | — | — |
| | | Phenol phthalin | *5 | 20 | 10 | | | 20 | — | — |
| Stress lowering agent | | Stress lowering agent | "CTBN1008SP"*6 | 2 | 3 | 1 | 2 | 2 | — | — |
| Additive | Adhesion impartation agent | Silane coupling agent | "KBM-403E"*7 | | | | 1 | | — | — |
| | | Silane coupling agent | "KBM-573"*8 | | | | | 1 | — | — |
| Solvent | | BCSA | *9 | 30 | 30 | 30 | 30 | 30 | — | — |
| Conduction test result (the number of samples (semiconductor devices) with no-problem were counted) | | | | 20/20 | 20/20 | 20/20 | 20/20 | 20/20 | 8/20 | 8/20 |
| Conduction test determination | | | | A | A | A | A | A | B | B |
| Insulation test result (the number of samples (semiconductor devices) with insulation were counted) | | | | 5/5 | 5/5 | 5/5 | 5/5 | 5/5 | 0/5 | 0/5 |
| Insulation test determination | | | | A | A | A | A | A | B | B |

*1 "EXA-830LVP" is a resin having an epoxy equivalent of 165 and produced by Dainippon ink and chemicals, Incorporated.
*2 "NC3000" is a solid epoxy resin having an epoxy equivalent of 272 and produced by Nippon Kayaku Co., Ltd.
*3 "2P4MZ" is produced by Shikoku Chemicals Corporation.
*4 "Gentistic acid" is produced by Midori Kagaku Co., Ltd.
*5 "Phenol phthalin" is produced by Tokyo Chemical Industry Co., Ltd.
*6 "CTBN1008SP" is produced by Ube Industries, Ltd.
*7 "KBM-403E" is an epoxy silane and produced by Shin-Etsu Chemical Co., Ltd.
*8 "KBM-573" is an aromatic secondary aminosilane and produced by Shin-Etsu Chemical Co., Ltd.
*9 "BCSA" is butyl cellosolve acetate and produced by Tokyo Chemical Industry Co., Ltd.

TABLE 3-A

| Function | Component | Chemical structure etc | Ex. 1B | Ex. 2B | Ex. 3B | Ex. 4B | Ex. 5B |
|---|---|---|---|---|---|---|---|
| Film-forming impartation and low elastic modulus impartation (Film-forming Resin) | (Meth)acrylic resin | *1 | 25.9 | 25.9 | 25.9 | 25.9 | 25.9 |
| Curable component (Thermosetting resin) | Epoxy resin | *2 | 24.5 | 24.5 | 24.5 | 24.5 | 24.5 |
| | Epoxy resin | *3 | 16.3 | 19.3 | 6.3 | 16.3 | 16.3 |
| | Epoxy resin | *4 | 7.5 | 7.5 | 7.5 | 7.5 | 7.5 |
| Curing agent | Phenol novolak | *5 | 20.2 | 20.2 | 20.2 | 20.2 | 20.2 |
| Adhesion impartation (1) | Silane coupling agent | 3-glycidoxypropyl trimethoxysilane | 0.1 | 0.1 | 0.1 | 0.1 | 0.1 |
| Adhesion Impartation (2) | Silane coupling agent | N-phenyl-3-aminopropyl trimethoxysilane | 0.35 | 0.35 | 0.35 | 0.35 | 0.35 |
| Curing catalyst | Imidazole | 2-phenyl hydroxyimidazole | 0.15 | 0.15 | 0.15 | 0.15 | 0.15 |
| | Imidazole | 2-phenyl-4-methyl hydroxyimidazole | | | | | |
| Flux-active curing agent | Sebacic acid | HOOC—$(CH_2)_8$—COOH | 5.0 | 2.0 | 15.0 | | |
| | Adipic acid | HOOC—$(CH_2)_4$—COOH | | | | | 5.0 |
| | | HOOC—$(CH_2)_{10}$—COOH | | | | | |
| | Gentistic acid | 2,5-dihydroxybezoic acid | | | | 5.0 | |
| | Total amount of resin | | 100.0 | 100.0 | 100.0 | 100.0 | 100.0 |
| Conductive powder | Solder powder | *6 | 60 | 60 | 60 | 60 | 60 |
| | | *7 | | | | | |
| | | *8 | | | | | |
| | | *9 | | | | | |
| Conduction test result (the number of samples (semiconductor devices) with no-problem were counted) | | | 20/20 | 20/20 | 20/20 | 20/20 | 20/20 |
| Conduction test determination | | | A | A | A | A | A |
| Insulation test result (the number of samples (semiconductor devices) with insulation were counted) | | | 5/5 | 5/5 | 5/5 | 5/5 | 5/5 |
| Insulation test determination | | | A | A | A | A | A |
| Melt viscosity at 138° C. of resin layer (bonding sheet) (Pa·s) | | | 430 | 350 | 660 | 450 | 490 |

| Function | Component | Chemical structure etc | Ex. 6B | Ex. 7B | Ex. 8B | Ex. 9B | Ex. 10B |
|---|---|---|---|---|---|---|---|
| Film-forming impartation and low elastic modulus impartation (Film-forming Resin) | (Meth)acrylic resin | *1 | 25.9 | 25.9 | 25.9 | 25.9 | 25.9 |
| Curable component (Thermosetting resin) | Epoxy resin | *2 | 24.5 | 24.5 | 24.5 | 24.5 | 24.5 |
| | Epoxy resin | *3 | 16.3 | 16.3 | 16.3 | 16.3 | 16.3 |
| | Epoxy resin | *4 | 7.5 | 7.5 | 7.5 | 7.5 | 7.5 |
| Curing agent | Phenol novolak | *5 | 20.2 | 20.2 | 20.2 | 20.2 | 20.2 |
| Adhesion impartation (1) | Silane coupling agent | 3-glycidoxypropyl trimethoxysilane | 0.1 | 0.1 | 0.1 | 0.1 | 0.1 |
| Adhesion Impartation (2) | Silane coupling agent | N-phenyl-3-aminopropyl trimethoxysilane | 0.35 | 0.35 | 0.35 | 0.35 | 0.35 |
| Curing catalyst | Imidazole | 2-phenyl hydroxyimidazole | 0.15 | | 0.15 | 0.15 | 0.15 |
| | Imidazole | 2-phenyl-4-methyl hydroxyimidazole | | 0.15 | | | |
| Flux-active curing agent | Sebacic acid | HOOC—$(CH_2)_8$—COOH | | 5.0 | 5.0 | 5.0 | 5.0 |
| | Adipic acid | HOOC—$(CH_2)_4$—COOH | | | | | |
| | | HOOC—$(CH_2)_{10}$—COOH | 5.0 | | | | |
| | Gentistic acid | 2,5-dihydroxybezoic acid | | | | | |
| | Total amount of resin | | 100.0 | 100.0 | 100.0 | 100.0 | 100.0 |
| Conductive powder | Solder powder | *6 | 60 | 60 | | | |
| | | *7 | | | 60 | | |
| | | *8 | | | | 60 | |
| | | *9 | | | | | 60 |
| Conduction test result (the number of samples (semiconductor devices) with no-problem were counted) | | | 20/20 | 20/20 | 20/20 | 20/20 | 20/20 |
| Conduction test determination | | | A | A | A | A | A |
| Insulation test result (the number of samples (semiconductor devices) with insulation were counted) | | | 5/5 | 5/5 | 5/5 | 5/5 | 5/5 |

TABLE 3-A-continued

| | | | | | |
|---|---|---|---|---|---|
| Insulation test determination | A | A | A | A | A |
| Melt viscosity at 138° C. of resin layer (bonding sheet) (Pa·s) | 550 | 740 | 810 | 1110 | 520 |

*[1]"(Meth)acrylic resin" is a 30 mol % butyl acrylate - 30 mol % ethyl acrylate - 40 mol % acrylonitrile copolymer having a molecular weight of 850,000.

*[2]"Epoxy resin" is a mixture of 2-[4-(2,3-epoxypropoxy)phenyl]-2-[4-[1,1-bis[4-(2,3-epoxypropoxy)phenyl] ethyl] phenyl] propane and 1,3-bis[4-[1-[4-(2,3-epoxypropoxy)phenyl]-1-[4-[1-[4-(2,3-epoxypropoxy)phenyl]-1-methyl] ethyl] phenyl] phenoxy]-2-propanol.

*[3]"Epoxy resin" is a cresol novolak type epoxy resin having a softening point of 80° C.

*[4]"Epoxy resin" is a liquid bis F type epoxy resin having an epoxy equivalent of 170.

*[5]"Phenol novolak" is a resin having a softening point of 100° C. and an OH equivalent of 104.

*[6]"Solder powder" is constituted from a 42Sn/58Bi alloy having a melting point of 138° C. and an average particle size of 35 μm.

*[7]"Solder powder" is constituted from a 42Sn/58Bi alloy having a melting point of 138° C. and an average particle size of 20 μm.

*[8]"Solder powder" is constituted from a 42Sn/58Bi alloy having a melting point of 138° C. and an average particle size of 12 μm.

*[9]"Solder powder" is constituted from a 48Sn/52In alloy having a melting point of 118° C. and an average particle size of 35 μm.

TABLE 3-B

| Function | Component | Chemical structure etc | Ex. 11B | Ex. 12B | Ex. 13B | Ex. 14B | Ex. 15B | Ex. 16B |
|---|---|---|---|---|---|---|---|---|
| Film-forming impartation and low elastic modulus impartation (Film-forming Resin) | (Meth)acrylic resin | *1 | | | | 15.0 | 45.0 | |
| | Polyvinyl butyral resin | *2 | 25.9 | | | | | |
| | Phenoxy resin | *3 | | 25.9 | | | | |
| | | *4 | | | | | 14.2 | 10.1 |
| | | *5 | | | | | 14.2 | 10.1 |
| Curable component (Thermosetting resin) | Epoxy resin | *6 | 24.5 | 24.5 | 30.0 | 12.0 | | 30.0 |
| | Epoxy resin | *7 | 16.3 | 16.3 | 16.3 | 16.3 | | 20.1 |
| | Epoxy resin | *8 | 7.5 | 7.5 | 7.5 | 7.5 | | |
| | Epoxy resin | *9 | | | | | 45.7 | |
| Curing agent | Phenol novolak | *10 | 20.2 | 20.2 | 25.5 | 13.6 | 20.4 | 24.3 |
| Adhesion impartation (1) | Silane coupling agent | 3-glycidoxypropyl trimethoxysilane | 0.1 | 0.1 | 0.1 | 0.1 | | 0.3 |
| Adhesion Impartation (2) | Silane coupling agent | N-phenyl-3-aminopropyl trimethoxysilane | 0.35 | 0.35 | 0.35 | 0.35 | 0.50 | |
| Curing catalyst | Imidazole | 2-phenyl hydroxyimidazole | 0.2 | 0.2 | 0.2 | 0.15 | | 0.1 |
| | Imidazole | 2-phenyl-4-methyl hydroxyimidazole | | | | | 0.01 | |
| Flux-active curing agent | Sebacic acid | HOOC—$(CH_2)_8$—COOH | 5.0 | 5.0 | 5.0 | 5.0 | 5.0 | 5.0 |
| | Phenol phthalin | | | | | | | |
| Total amount of resin | | | 100.0 | 100.0 | 100.0 | 100.0 | 100.0 | 100.0 |
| Conductive powder | Solder powder | *11 | 60 | 60 | 60 | 60 | 90 | 90 |
| Conduction test result (the number of samples (semiconductor devices) with no-problem were counted) | | | 20/20 | 20/20 | 20/20 | 20/20 | 20/20 | 20/20 |
| Conduction test determination | | | A | A | A | A | A | A |
| Insulation test result (the number of samples (semiconductor devices) with insulation were counted) | | | 5/5 | 5/5 | 5/5 | 5/5 | 5/5 | 5/5 |
| Insulation test determination | | | A | A | A | A | A | A |
| Melt viscosity at 138° C. of resin layer (bonding sheet) (Pa·s) | | | 1340 | 34 | 6580 | 7630 | 70 | 74 |

| Function | Component | Chemical structure etc | Ex. 17B | Ex. 18B | Ex. 19B | Ex. 20B | Ex. 21B |
|---|---|---|---|---|---|---|---|
| Film-forming impartation and low elastic modulus impartation (Film-forming Resin) | (Meth)acrylic resin | *1 | | | | | |
| | Polyvinyl butyral resin | *2 | | | | | |
| | Phenoxy resin | *3 | | | | | |
| | | *4 | 14.2 | 10.1 | 28.4 | 28.4 | 15.0 |
| | | *5 | 14.2 | 10.1 | | | |
| Curable component (Thermosetting resin) | Epoxy resin | *6 | | | 30.0 | | |
| | Epoxy resin | *7 | | | 20.1 | | |
| | Epoxy resin | *8 | | | | | |
| | Epoxy resin | *9 | 45.7 | | 45.7 | 45.7 | 54.1 |
| Curing agent | Phenol novolak | *10 | 20.4 | 24.3 | 20.4 | 20.4 | 25.4 |
| Adhesion impartation (1) | Silane coupling agent | 3-glycidoxypropyl trimethoxysilane | | 0.3 | | | |
| Adhesion Impartation (2) | Silane coupling agent | N-phenyl-3-aminopropyl trimethoxysilane | 0.50 | | 0.50 | 0.50 | 0.50 |
| Curing catalyst | Imidazole | 2-phenyl hydroxyimidazole | | 0.1 | | | |
| | Imidazole | 2-phenyl-4-methyl hydroxyimidazole | 0.01 | | 0.01 | 0.01 | 0.01 |

TABLE 3-B-continued

| | | | | | | | | |
|---|---|---|---|---|---|---|---|---|
| Flux-active curing agent | Sebacic acid | HOOC—(CH$_2$)$_8$—COOH | | | | 5.0 | 5.0 | 5.0 |
| | Phenol phthalin | | | 5.0 | 5.0 | | | |
| | | Total amount of resin | | 100.0 | 100.0 | 100.0 | 100.0 | 100.0 |
| Conductive powder | Solder powder | *11 | | 90 | 90 | 90 | 40 | 40 |
| Conduction test result (the number of samples (semiconductor devices) with no-problem were counted) | | | | 20/20 | 20/20 | 20/20 | 20/20 | 20/20 |
| Conduction test determination | | | | A | A | A | A | A |
| Insulation test result (the number of samples (semiconductor devices) with insulation were counted) | | | | 5/5 | 5/5 | 5/5 | 5/5 | 5/5 |
| Insulation test determination | | | | A | A | A | A | A |
| Melt viscosity at 138° C. of resin layer (bonding sheet) (Pa·s) | | | | 72 | 75 | 0.65 | 0.35 | 0.20 |

*1"(Meth)acrylic resin" is a 30 mol % butyl acrylate - 30 mol % ethyl acrylate - 40 mol % acrylonitrile copolymer having a molecular weight of 850,000.
*2"Polyvinyl butyral resin" is a resin having a polymerization degree of 1,700, an acetylation degree of 3 mol % or less, a butyralation degree of 65 mol % or more, and a flow softening point of 225° C.
*3"Phenoxy resin" is a resin having bisphenol A chemical structures, and a number average molecular weight of 30,000.
*4"Phenoxy resin" is a resin having bisphenol F chemical structures, and a weight average molecular weight of 50,000.
*5"Phenoxy resin" is a resin having fluorene chemical structures, and a weight average molecular weight of 50,000.
*6"Epoxy resin" is a mixture of 2-[4-(2,3-epoxypropoxy)phenyl]-2-[4-[1,1-bis[4-(2,3-epoxypropoxy)phenyl] ethyl] phenyl] propane and 1,3-bis[4-[1-[4-(2,3-epoxypropoxy)phenyl]-1-[4-[1-[4-(2,3-epoxypropoxy)phenyl]-1-methyl] ethyl] phenyl] phenoxy]-2-propanol.
*7"Epoxy resin" is a cresol novolak type epoxy resin having a softening point of 80° C.
*8"Epoxy resin" is a liquid bis F type epoxy resin having an epoxy equivalent of 170.
*9"Epoxy resin" is a liquid bis A type epoxy resin having an epoxy equivalent of 180.
*10"Phenol novolak" is a resin having a softening point of 100° C. and an OH equivalent of 104.
*11"Solder powder" is constituted from a 42Sn/58Bi alloy having a melting point of 138° C. and an average particle size of 35 μm.

TABLE 4

| Function | Component | Chemical structure etc | Com. Ex. 1B | Com. Ex. 2B | Com. Ex. 3B |
|---|---|---|---|---|---|
| Film-forming impartation and low elastic modulus impartation (Film-forming Resin) | (Meth)acrylic resin | *1 | 25.9 | — | — |
| Curable component (Thermosetting resin) | Epoxy resin | *2 | 24.5 | — | — |
| | Epoxy resin | *3 | 16.3 | — | — |
| | Epoxy resin | *4 | 7.5 | — | — |
| Curing agent | Phenol novolak | *5 | 25.2 | — | — |
| Adhesion impartation (1) | Silane coupling agent | 3-glycidoxypropyl trimethoxysilane | 0.1 | — | — |
| Adhesion impartation (2) | Silane coupling agent | N-phenyl-3-aminopropyl trimethoxysilane | 0.35 | — | — |
| Curing catalyst | Imidazole | 2-phenyl hydroxyimidazole | 0.15 | — | — |
| | | Total amount of resin | 100.0 | — | — |
| Conductive powder | Solder powder | *6 | 60.0 | — | — |
| Conduction test result (the number of samples (semiconductor devices) with no-problem were counted) | | | 0/20 | 0/20 | 0/20 |
| Conduction test determination | | | B | B | B |
| Insulation test result (the number of samples (semiconductor devices) with insulation were counted) | | | 0/5 | 3/5 | 1/5 |
| Insulation test determination | | | B | B | B |
| Melt viscosity at 138° C. of resin layer (bonding sheet) (Pa·s) | | | 1340 | — | — |

*1"(Meth)acrylic resin" is a 30 mol % butyl acrylate - 30 mol % ethyl acrylate —40 mol % acrylonitrile copolymer having a molecular weight of 850,000.
*2"Epoxy resin" is a mixture of 2-[4-(2,3-epoxypropoxy)phenyl]-2-[4-[1,1-bis[4-(2,3-epoxypropoxy)phenyl] ethyl] phenyl] propane and 1,3-bis[4-[1-[4-(2,3-epoxypropoxy)phenyl]-1-[4-[1-[4-(2,3-epoxypropoxy)phenyl]-1-methyl] ethyl] phenyl] phenoxy]-2-propanol.
*3"Epoxy resin" is a cresol novolak type epoxy resin having a softening point of 80° C.
*4"Epoxy resin" is a liquid bis F type epoxy resin having an epoxy equivalent of 170.
*5"Phenol novolak" is a resin having a softening point of 100° C. and an OH equivalent of 104.
*6"Solder powder" is constituted from a 42Sn/58Bi alloy having a melting point of 138° C. and an average particle size of 35 μm.

As shown in Tables 1-A to 1-C, 2-A, 2-B, 3-A, 3-B and 4, good conduction was recognized in all of the semiconductor devices of the respective Examples. In contrast, conduction was not recognized in 60% of the evaluated package samples (semiconductor devices) of Comparative Examples 1A and 2A. Further, conduction was not recognized in 100% of the evaluated package samples (semiconductor devices) of Comparative Examples 1B to 3B.

In addition, good insulation was ensured between the adjacent wiring lines in all of the semiconductor devices of the respective Examples. In contrast, insulation was not ensured between the adjacent wiring lines in 100% of the evaluated package samples (semiconductor devices) of Comparative Examples 1A and 2A. Further, insulation was not ensured between the adjacent wiring lines in 40 to 100% of the evaluated package samples (semiconductor devices) of Comparative Examples 1B to 3B.

This makes it clear that electrical connection can be stably made between the penetrating metal electrodes (connector portions) in the semiconductor elements of the semiconductor devices of the present invention.

INDUSTRIAL APPLICABILITY

According to the present invention, it is possible to stably perform electrical connection between connector portions provided in semiconductor wafers stacked, thereby producing a semiconductor wafer bonded body in which the semiconductor wafers are bonded together through a bonding layer.

Further, in the case where constituent materials of the bonding layer contain solder powder, the connector portions can be electrically connected together without having to form solder bumps on the connector portions of the semiconductor wafers.

Furthermore, a plurality of semiconductor elements can be efficiently manufactured by dicing the above semiconductor wafer bonded body produced.

In addition, it is possible to manufacture a semiconductor device provided with the semiconductor elements having excellent reliability in the electrical connection between the connector portions. This means that the present invention is industrially applicable.

What is claimed is:

1. A method for bonding semiconductor wafers, comprising:
a first process of preparing a first semiconductor wafer including a functional surface and a plurality of first connector portions extending through the first semiconductor wafer in a thickness direction thereof and having functional surface side ends, and a second semiconductor wafer including a rear surface, a plurality of second connector portions extending through the second semiconductor wafer in a thickness direction thereof and having rear surface side ends and a plurality of solder bumps connected to the rear surface side ends of the second connector portions;
a second process of interposing a bonding layer containing a flux-active curing agent and a thermosetting resin as constituent materials thereof between the first semiconductor wafer and the second semiconductor wafer and positioning themselves with alignment so that the functional surface side ends of the first connector portions correspond to the solder bumps connected to the rear surface side ends of the second connector portions, thereby producing a semiconductor wafer stacked body in which the first semiconductor wafer and the second semiconductor wafer are stacked together; and
a third process of compressing the semiconductor wafer stacked body in a thickness direction thereof while heating it so that the first semiconductor wafer and the second semiconductor wafer are fixed together by melting and solidifying the solder bumps while curing the thermosetting resin, thereby producing a semiconductor wafer bonded body in which the first connector portions and the second connector portions are electrically connected together through solidified products obtained by melting and solidifying the solder bumps.

2. The method as claimed in claim 1, wherein the bonding layer is formed in the second process by interposing a film-shaped bonding shed containing the constituent materials of the bonding layer between the first semiconductor wafer and the second semiconductor wafer.

3. The method as claimed in claim 1, wherein the bonding layer is formed in the second process by applying a liquid material containing the constituent materials of the bonding layer on at least one of the functional surface of the first semiconductor wafer and the rear surface of the second semiconductor wafer.

4. The method as claimed in claim 1, wherein the first semiconductor wafer prepared in the first process further includes a plurality of solder bumps connected to the functional surface ends of the first connector portions thereof.

5. The method as claimed in claim 1, wherein when heating and compressing the semiconductor wafer stacked body in the third process, the curing of the thermosetting resin is completed after the solder bumps have been melted.

6. The method as claimed in claim 1, wherein a thickness of the bonding layer in the semiconductor wafer bonded body is in the range of 3 to 200 µm.

7. The method as claimed in claim 1, wherein the constituent materials of the bonding layer further comprise a film-forming resin containing at least one of a (meth)acrylic resin, a phenoxy resin and a polyimide resin.

8. The method as claimed in claim 1, wherein the bonding layer has such a property that it can reduce an oxidation-treated copper plate at a copper oxide reduction rate of 70% or more, when being formed on a surface of the oxidation-treated copper plate and then being subjected to a reduction treatment at 230° C. for one minute in the atmosphere, the copper oxide reduction rate being represented by the following equation (I):

$$\text{copper oxide reduction rate } (\%) = \left\{ 1 - \frac{\left(\begin{array}{c}\text{oxygen atom concentration}\\ \text{after reduction treatment}\end{array}\right)}{\left(\begin{array}{c}\text{oxygen atom concentration}\\ \text{after oxidation treatment}\end{array}\right)} \right\} \times 100. \qquad (I)$$

9. A method for bonding semiconductor wafers, comprising:
a first process of preparing a first semiconductor wafer including a functional surface and a plurality of first connector portions extending through the first semiconductor wafer in a thickness direction thereof and having functional surface side ends, and a second semiconductor wafer including a rear surface and a plurality of second connector portions extending through the second semiconductor wafer in a thickness direction thereof and having rear surface side ends;
a second process of interposing a bonding layer containing a flux-active curing agent, a thermosetting resin and solder powder as constituent materials thereof between the first semiconductor wafer and the second semiconductor wafer and positioning themselves with alignment so that the functional surface side ends of the first connector portions correspond to the rear surface side ends of the second connector portions, thereby producing a semiconductor wafer stacked body in which the first semiconductor wafer and the second semiconductor wafer are stacked together; and a third process of compressing the semiconductor wafer stacked body in a thickness direction thereof while heating it so that the first semiconductor wafer and the second semiconductor wafer are fixed together by melting solder particles of the solder powder and solidifying the molten solder particles aggregated between the first connector portions and the second connector portions while curing the thermosetting resin, thereby producing a semiconductor wafer bonded body in which the first connector portions and the second connector portions are electrically connected together through solidified products obtained by solidifying the molten solder particles aggregated.

10. The method as claimed in claim 9, wherein the bonding layer is formed in the second process by interposing a film-shaped bonding sheet containing the constituent materials of the bonding layer between the first semiconductor wafer and the second semiconductor wafer.

11. The method as claimed in claim 9, wherein the bonding layer is formed in the second process by applying a liquid material containing the constituent materials of the bonding layer on at least one of the functional surface of the first semiconductor wafer and the rear surface of the second semiconductor wafer.

12. The method as claimed in claim 9, wherein when heating and compressing the semiconductor wafer stacked body in the third process, the curing of the thermosetting resin is completed after the solder powder has been melted.

13. The method as claimed in claim 9, wherein a thickness of the bonding layer in the semiconductor wafer bonded body is in the range of 3 to 300 μm.

14. The method as claimed in claim 9, wherein an amount of the solder powder contained in the bonding layer is in the range of 20 to 250 parts by weight, based on 100 parts by weight of a total amount of the constituent materials of the bonding layer excluding the solder powder.

15. The method as claimed in claim 9, wherein in the case where the bonding layer has a thickness of 100 μm, a melt viscosity at 138° C. thereof is in the range of 0.01 to 10,000 Pa·s.

16. The method as claimed in claim 1 or 9, wherein the flux-active curing agent has at least one of a carboxyl group and a phenolic hydroxyl group.

17. A method for manufacturing a semiconductor device, comprising the processes of:

preparing a semiconductor wafer bonded body produced by the method defined by claim 1 or 9 in which a plurality of each circuit portions are formed on the functional surface of the first semiconductor wafer;

dicing the semiconductor wafer bonded body in a corresponding relationship with the each circuit portions, thereby separating the semiconductor wafer bonded body into a plurality of semiconductor elements with the each circuit portions; and mounting the diced semiconductor elements on a substrate.

18. The method as claimed in claim 9, wherein in the third process, the molten solder particles are aggregated between the first connector portions and the second connector portions by being self-aligned.

19. The method as claimed in claim 1 or 9, wherein the bonding layer further contains another curing agent than the flux-active curing agent for enhancing curability of the thermosetting resin.

20. The method as claimed in claim 19, wherein the thermosetting resin comprises an epoxy resin, and another curing agent comprises phenols.

* * * * *